US011871589B2

(12) United States Patent
Karda et al.

(10) Patent No.: US 11,871,589 B2
(45) Date of Patent: *Jan. 9, 2024

(54) MEMORY DEVICE HAVING 2-TRANSISTOR MEMORY CELL AND ACCESS LINE PLATE

(71) Applicant: Micron Technology, Inc., Boise, ID (US)

(72) Inventors: Kamal M. Karda, Boise, ID (US); Karthik Sarpatwari, Boise, ID (US); Haitao Liu, Boise, ID (US); Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/745,298

(22) Filed: May 16, 2022

(65) Prior Publication Data

US 2022/0278103 A1  Sep. 1, 2022

Related U.S. Application Data

(63) Continuation of application No. 17/003,077, filed on Aug. 26, 2020, now Pat. No. 11,335,684.

(Continued)

(51) Int. Cl.
*H01L 27/00* (2006.01)
*H01L 29/00* (2006.01)
(Continued)

(52) U.S. Cl.
CPC .......... *H10B 99/00* (2023.02); *H01L 27/124* (2013.01); *H01L 27/1225* (2013.01);
(Continued)

(58) Field of Classification Search
CPC ........ H10B 99/00; H10B 99/10; H10B 99/22; H10B 12/00; H10B 12/09; H10B 41/70;
(Continued)

(56) References Cited

U.S. PATENT DOCUMENTS 5,357,464 A  10/1994  Shukuri et al.
5,712,817 A   1/1998  Suh
(Continued)

FOREIGN PATENT DOCUMENTS

CN  114303242 A   4/2022
JP  H05110016 A   4/1993
(Continued)

OTHER PUBLICATIONS

"International Application Serial No. PCT/US2020/048033, International Search Report dated Dec. 8, 2020", 3 pgs.
(Continued)

*Primary Examiner* — Nikolay K Yushin
(74) *Attorney, Agent, or Firm* — Schwegman Lundberg & Woessner, P.A.

(57) ABSTRACT

Some embodiments include apparatuses and methods using a substrate, a pillar having a length perpendicular to the substrate, a first conductive plate, a second conductive plate, a memory cell located between the first and second conductive plates and electrically separated from the first and second conductive plates, and a conductive connection. The first conductive plate is located in a first level of the apparatus and being separated from the pillar by a first dielectric located in the first level. The second conductive plate is located in a second level of the apparatus and being separated from the pillar by a second dielectric located in the second level. The memory cell includes a first semiconductor material located in a third level of the apparatus between the first and second levels and contacting the pillar and the (Continued)

conductive connection, and a second semiconductor material located in a fourth level of the apparatus between the first and second levels and contacting the pillar.

20 Claims, 18 Drawing Sheets

Related U.S. Application Data

(60) Provisional application No. 62/892,995, filed on Aug. 28, 2019.

(51) Int. Cl.
*H10B 99/00* (2023.01)
*H01L 27/12* (2006.01)
*H01L 29/788* (2006.01)
*H01L 29/24* (2006.01)
*H01L 29/786* (2006.01)

(52) U.S. Cl.
CPC .......... *H01L 27/1251* (2013.01); *H01L 29/24* (2013.01); *H01L 29/7869* (2013.01); *H01L 29/7881* (2013.01); *H01L 29/78672* (2013.01)

(58) Field of Classification Search
CPC ..... H10B 41/27; H10B 41/10; H01L 27/1225; H01L 27/124; H01L 27/1251; H01L 29/24; H01L 29/78672; H01L 29/7869; H01L 29/78811; H01L 29/66742; H01L 29/66; H01L 29/78648; H01L 29/786; H01L 29/41733; H01L 29/417; H01L 29/4908; H01L 27/088; H01L 21/8258; H01L 21/02565; H01L 21/02
See application file for complete search history.

(56) References Cited

U.S. PATENT DOCUMENTS

| 11,335,684 | B2 | 5/2022 | Karda et al. |
| 2012/0051116 | A1 | 3/2012 | Inoue et al. |
| 2019/0259761 | A1 | 8/2019 | Takemura et al. |
| 2021/0066298 | A1 | 3/2021 | Karda et al. |

FOREIGN PATENT DOCUMENTS

| TW | 201843811 A | 12/2018 |
| TW | 201911537 A | 3/2019 |
| TW | 202119595 A | 5/2021 |
| TW | 1753557 B | 1/2022 |
| WO | WO-2021041567 A1 | 3/2021 |

OTHER PUBLICATIONS

"International Application Serial No. PCT/US2020/048033, Written Opinion dated Dec. 8, 2020", 4 pgs.
"Taiwanese Application Serial No. 109129639, Office Action dated Apr. 6, 2021", w/ English Translation, 7 pgs.
"International Application Serial No. PCT/US2020/048033, International Preliminary Report on Patentability dated Mar. 10, 2022", 6 pgs.

MEMORY DEVICE HAVING 2-TRANSISTOR MEMORY CELL AND ACCESS LINE PLATE

PRIORITY APPLICATION

This application is a continuation of U.S. application Ser. No. 17/003,077, filed Aug. 26, 2020, which claims the benefit of priority to U.S. Provisional Application Ser. No. 62/892,995, filed Aug. 28, 2019, all of which are incorporated herein by reference in their entirety.

BACKGROUND

Memory devices are widely used in computers and many other electronic items to store information. Memory devices are generally categorized into two types: volatile memory devices and non-volatile memory devices. A memory device usually has numerous memory cells to store information. In a volatile memory device, information stored in the memory cells is lost if supply power is disconnected from the memory device. In a non-volatile memory device, information stored in the memory cells is retained even if supply power is disconnected from the memory device.

The description herein involves volatile memory devices. Most conventional volatile memory devices store information in the form of charge in a capacitor structure included in the memory cell. As demand for device storage density increases, many conventional techniques provide ways to shrink the size of the memory cell in order to increase device storage density for a given device area. However, physical limitations and fabrication constraints may pose a challenge to such conventional techniques if the memory cell size is to be shrunk to a certain dimension. Unlike some conventional memory devices, the memory devices described herein include features that can overcome challenges faced by conventional techniques.

DETAILED DESCRIPTION

The memory device described herein includes volatile memory cells in which each of the memory cells can include two transistors (2T). One of the two transistors has a charge storage structure, which can form a memory element of the memory cell to store information. The memory device described herein can have a structure (e.g., a 4F2 cell footprint) that allows the size of the memory device to be relatively smaller than the size of similar conventional memory devices. The described memory device can include a single access line (e.g., word line) to control two transistors of a memory cell. This can lead to reduced power dissipation and improved processing. Each of the memory cells of the described memory device can include a cross-point gain cell structure (and cross-point operation), such that a memory cell can be accessed using a single access line (e.g., word line) and single data line (e.g., bit line) during an operation (e.g., a read or write operation) of the memory device. Further, the described memory device can have multiple decks of memory cells where the decks can be formed together. This can reduce the cost (e.g., cost per bit) of the memory device. Other improvements and benefits of the described memory device and its variations are discussed below with reference to FIG. 1 through FIG. 18.

Figure 1:
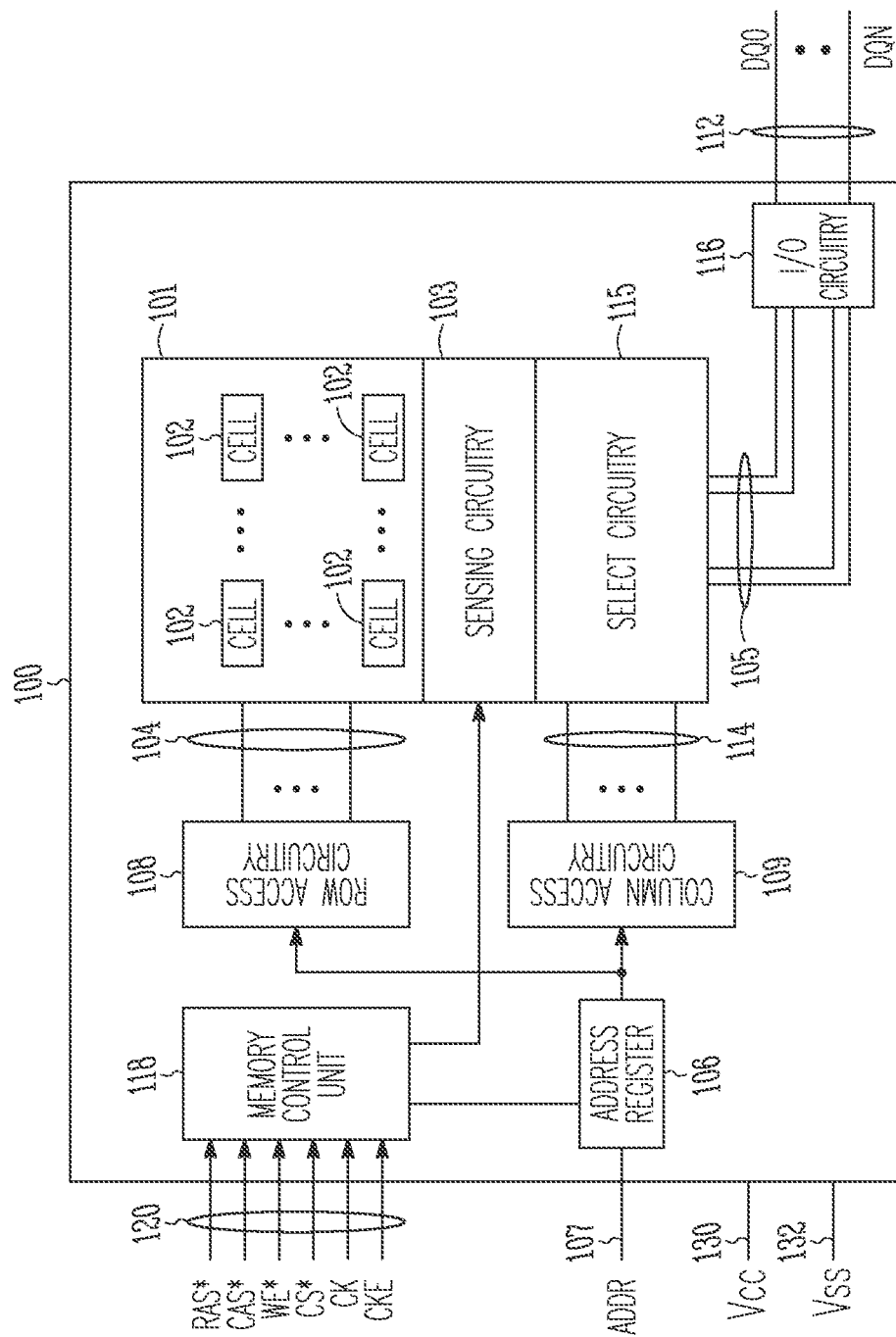
FIG. 1 shows a block diagram of an apparatus in the form of a memory device including volatile memory cells, according to some embodiments described herein.

FIG. 1 shows a block diagram of an apparatus in the form of a memory device 100 including volatile memory cells, according to some embodiments described herein. Memory device 100 includes a memory array 101, which can contain memory cells 102. Memory device 100 can include a volatile memory device such that memory cells 102 can be volatile memory cells. An example of memory device 100 includes a dynamic random-access memory (DRAM) device. Information stored in memory cells 102 of memory device 100 may be lost (e.g., invalid) if supply power (e.g., supply voltage Vcc) is disconnected from memory device 100. Hereinafter, supply voltage Vcc is referred to as representing some voltage levels; however, such voltage levels are not limited to a supply voltage (e.g., Vcc) of the memory device (e.g., memory device 100). For example, if the memory device (e.g., memory device 100) has an internal voltage generator (not shown in FIG. 1) that generates an internal voltage based on supply voltage Vcc, such an internal voltage may be used instead of supply voltage Vcc.

In a physical structure of memory device 100, each of memory cells 102 can include transistors (e.g., two transistors) formed vertically (e.g., stacked on different layers) in different levels over a substrate (e.g., semiconductor substrate) of memory device 100. Memory device 100 can also include multiple levels (e.g., multiple decks) of memory cells where one level (e.g., one deck) of memory cells can be formed over (e.g., stacked on) another level (e.g., another deck) of additional memory cells. The structure of memory array 101, including memory cells 102, can include the structure of memory arrays and memory cells described below with reference to FIG. 2 through FIG. 18.

As shown in FIG. 1, memory device 100 can include access lines 104 (e.g., "word lines") and data lines (e.g., bit lines) 105. Memory device 100 can use signals (e.g., word line signals) on access lines 104 to access memory cells 102 and data lines 105 to provide information (e.g., data) to be stored in (e.g., written) or read (e.g., sensed) from memory cells 102.

Memory device 100 can include an address register 106 to receive address information ADDR (e.g., row address signals and column address signals) on lines (e.g., address lines) 107. Memory device 100 can include row access circuitry (e.g., X-decoder) 108 and column access circuitry (e.g., Y-decoder) 109 that can operate to decode address information ADDR from address register 106. Based on decoded address information, memory device 100 can determine which memory cells 102 are to be accessed during a memory operation. Memory device 100 can perform a write operation to store information in memory cells 102, and a read operation to read (e.g., sense) information (e.g., previously stored information) in memory cells 102. Memory device 100 can also perform an operation (e.g., a refresh operation) to refresh (e.g., to keep valid) the value of information stored in memory cells 102. Each of memory cells 102 can be configured to store information that can represent at most one bit (e.g., a single bit having a binary 0 ("0") or a binary 1 ("1"), or more than one bit (e.g., multiple bits having a combination of at least two binary bits).

Memory device 100 can receive a supply voltage, including supply voltages Vcc and Vss, on lines 130 and 132, respectively. Supply voltage Vss can operate at a ground potential (e.g., having a value of approximately zero volts). Supply voltage Vcc can include an external voltage supplied to memory device 100 from an external power source such as a battery or an alternating current to direct current (AC-DC) converter circuitry.

As shown in FIG. 1, memory device 100 can include a memory control unit 118, which includes circuitry (e.g., hardware components) to control memory operations (e.g., read and write operations) of memory device 100 based on control signals on lines (e.g., control lines) 120. Examples of signals on lines 120 include a row access strobe signal RAS*, a column access strobe signal CAS*, a write-enable signal WE*, a chip select signal CS*, a clock signal CK, and a clock-enable signal CKE. These signals can be part of signals provided to a DRAM device.

As shown in FIG. 1, memory device 100 can include lines (e.g., global data lines) 112 that can carry signals DQ0 through DQN. In a read operation, the value (e.g., "0" or "1") of information (read from memory cells 102) provided to lines 112 (in the form of signals DQ0 through DQN) can be based on the values of the signals on data lines 105. In a write operation, the value (e.g., "0" or "1") of information provided to data lines 105 (to be stored in memory cells 102) can be based on the values of signals DQ0 through DQN on lines 112.

Memory device 100 can include sensing circuitry 103, select circuitry 115, and input/output (I/O) circuitry 116. Column access circuitry 109 can selectively activate signals on lines (e.g., select lines) based on address signals ADDR. Select circuitry 115 can respond to the signals on lines 114 to select signals on data lines 105. The signals on data lines 105 can represent the values of information to be stored in memory cells 102 (e.g., during a write operation) or the values of information read (e.g., sensed) from memory cells 102 (e.g., during a read operation).

I/O circuitry 116 can operate to provide information read from memory cells 102 to lines 112 (e.g., during a read operation) and to provide information from lines 112 (e.g., provided by an external device) to data lines 105 to be stored in memory cells 102 (e.g., during a write operation). Lines 112 can include nodes within memory device 100 or pins (or solder balls) on a package where memory device 100 can reside. Other devices external to memory device 100 (e.g., a hardware memory controller or a hardware processor) can communicate with memory device 100 through lines 107, 112, and 120.

Memory device 100 may include other components, which are not shown in FIG. 1 so as not to obscure the example embodiments described herein. At least a portion of memory device 100 (e.g., a portion of memory array 101) can include structures and operations similar to or identical to any of the memory devices described below with reference to FIG. 2 through FIG. 18.

Figure 2:
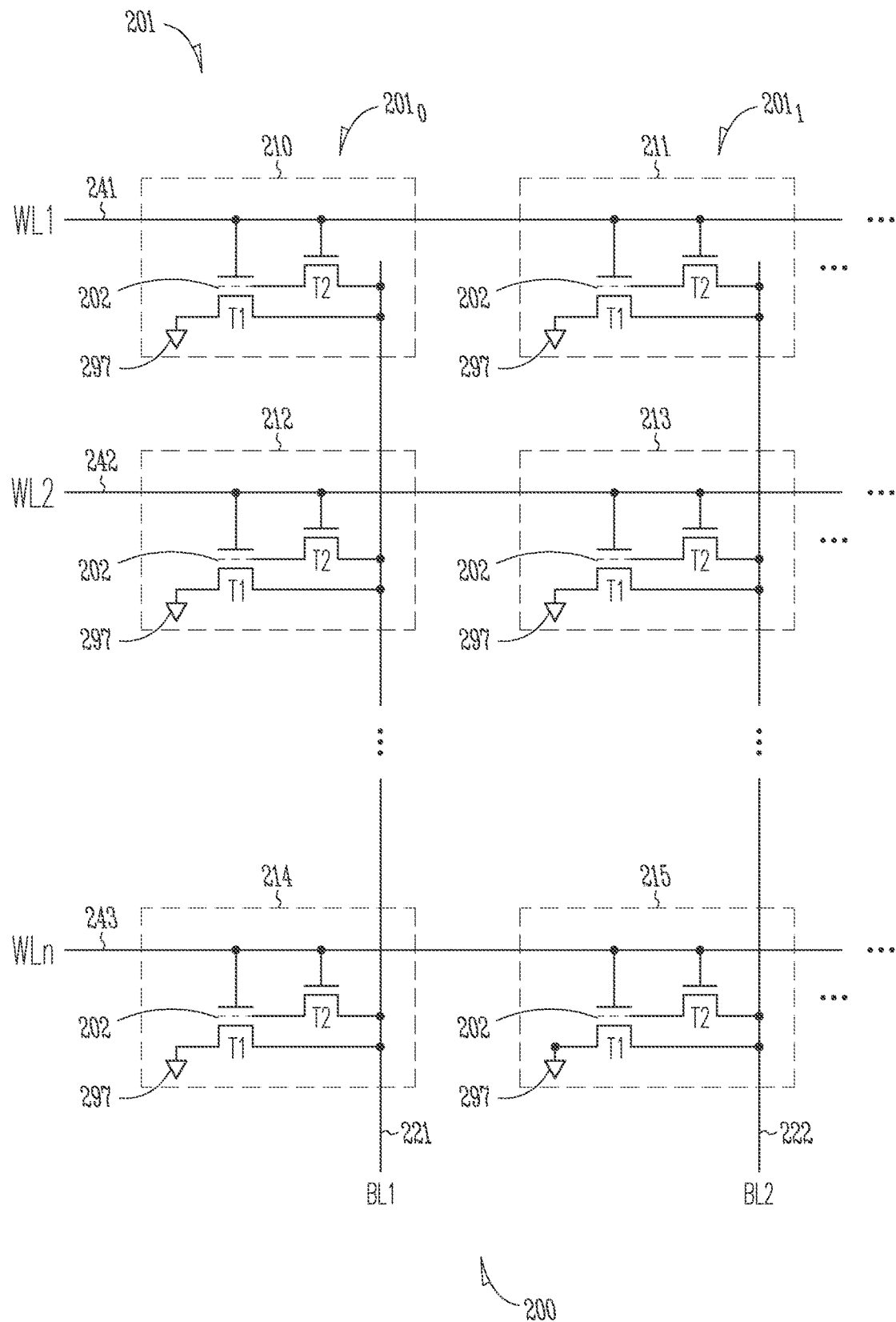
FIG. 2 shows a schematic diagram of a portion of a memory device including a memory array of two-transistor (2T) memory cells, according to some embodiments described herein.

FIG. 2 shows a schematic diagram of a portion of a memory device 200 including a memory array 201 of 2T memory cells, according to some embodiments described herein. Memory device 200 can correspond to memory device 100 of FIG. 1. For example, memory array 201 can form part of memory array 101 of FIG. 1. As shown in FIG. 2, memory device 200 can include memory cells 210 through 215, which are volatile memory cells (e.g., DRAM cells). For simplicity, similar or identical elements among memory cells 210 through 215 are given the same labels.

Figure 5:
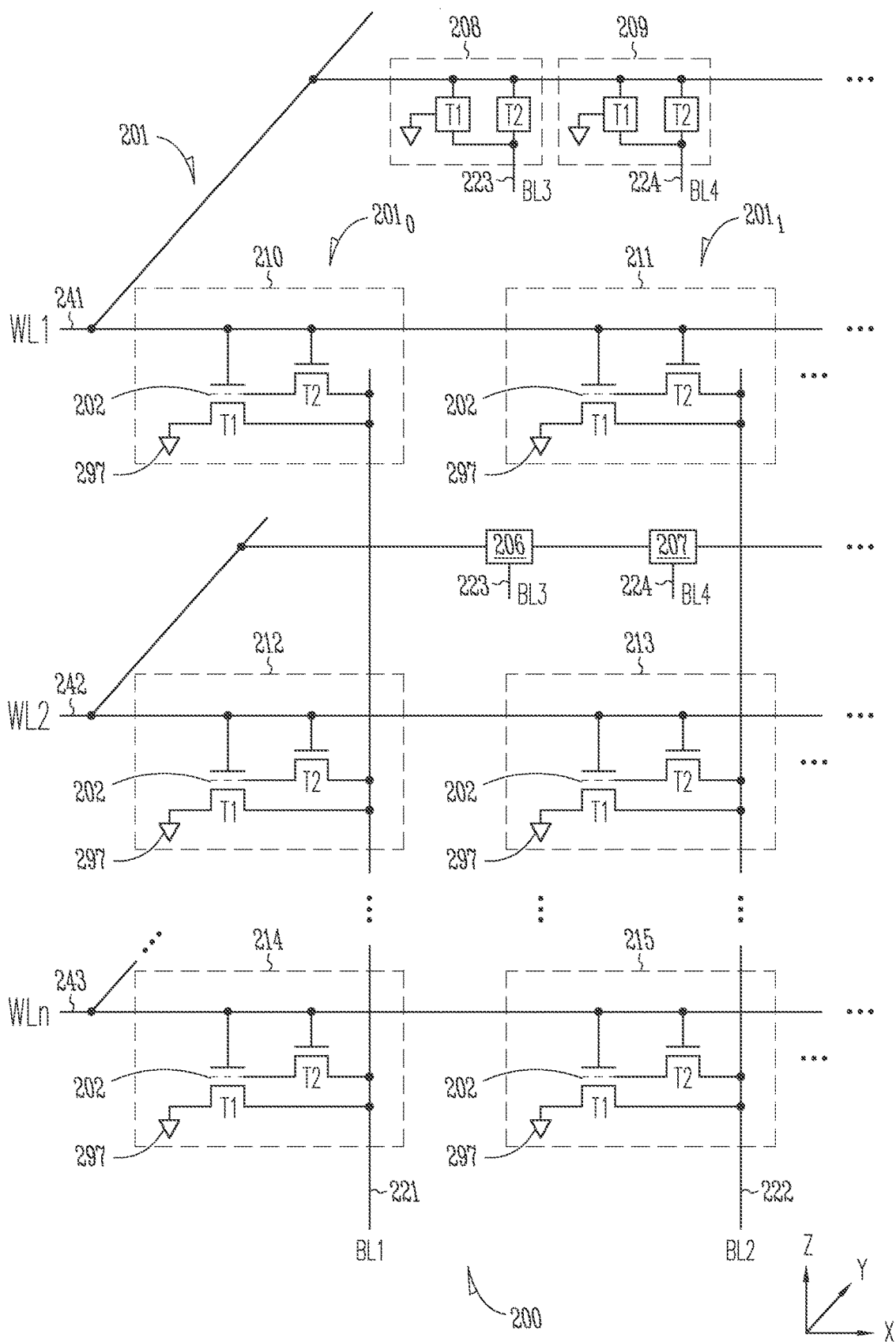
FIG. 5 shows the memory device of FIG. 2, including additional memory cells, according to some embodiments described herein.

FIG. 2 shows only a portion of memory cells in the X-direction and the Z-direction, which can correspond to the directions of the structure (physical structure) of memory device 200. However, memory device 200 also includes additional memory cells (not shown) located in the Y-direction. FIG. 5 (described below) shows some of such additional memory cells.

As shown in FIG. 2, each of memory cells 210 through 215 can include two transistors T1 and T2. Thus, each of memory cells 210 through 215 can be called a 2T memory cell (e.g., 2T gain cell). Each of transistors T1 and T2 can include a field-effect transistor (FET). As an example, transistor T1 can be a p-channel FET (PFET), and transistor T2 can be an n-channel FET (NFET). Part of transistor T1 can include a structure of a p-channel metal-oxide semiconductor (PMOS) transistor FET (PFET). Thus, transistor T1 can include an operation similar to that of a PMOS transistor. Part of transistor T2 can include a structure of an n-channel metal-oxide semiconductor (NMOS). Thus, transistor T2 can include an operation similar to that of a NMOS transistor.

Transistor T1 of memory device 200 can include a charge-storage based structure (e.g., a floating-gate based). As shown in FIG. 2, each of memory cells 210 through 215 can include a charge storage structure 202, which can include the floating gate of transistor T1. Charge storage structure 202 can form the memory element of a respective memory cell among memory cells 210 through 215. Charge storage structure 202 can store charge. The value (e.g., "0" or "1") of information stored in a particular memory cell among memory cells 210 through 215 can be based on the amount of charge in charge storage structure 202 of that particular memory cell.

As shown in FIG. 2, transistor T2 (e.g., the channel region of transistor T2) of a particular memory cell among memory cells 210 through 215 can be electrically coupled to (e.g., directly coupled to) charge storage structure 202 of that particular memory cell. Thus, a circuit path (e.g., current path) can be formed directly between transistor T2 of a particular memory cell and charge storage structure 202 of that particular memory cell during an operation (e.g., a write operation) of memory device 200.

Memory cells 210 through 215 can be arranged in memory cell groups $201_0$ and $201_1$. FIG. 2 shows two memory cell groups (e.g., $201_0$ and $201_1$) as an example. However, memory device 200 can include more than two memory cell groups. Memory cell groups $201_0$ and $201_1$ can include the same number of memory cells. For example, memory cell group $201_0$ can include memory cells 210, 212, and 214, and memory cell group $201_1$ can include memory cells 211, 213, and 215. FIG. 2 shows three memory cells in each of memory cell groups $201_0$ and $201_1$ as an example. The number of memory cells in memory cell groups $201_0$ and $201_1$ can be different from three.

Memory device 200 can perform a write operation to store information in memory cells 210 through 215 and a read operation to read (e.g., sense) information from memory cells 210 through 215. Memory device 200 can be configured to operate as a DRAM device. However, unlike some conventional DRAM devices that store information in a structure such as a container for a capacitor, memory device 200 can store information in the form of charge in charge storage structure 202 (which can be a floating gate structure). As mentioned above, charge storage structure 202 can be the floating gate of transistor T1. During an operation (e.g., a read or write operation) of memory device 200, an access line (e.g., a single access line) and a data line (e.g., a single data line) can be used to access a selected memory cell (e.g., target memory cell).

As shown in FIG. 2, memory device 200 can include access lines (e.g., word lines) 241, 242, and 243 that can carry respective signals (e.g., word line signals) WL1, WL2, and WLn. Access lines 241, 242, and 243 can be used to access both memory cell groups $201_0$ and $201_1$. Each of access lines 241, 242, and 243 can be structured as at least one conductive line (one conductive line or multiple conductive lines that can be electrically coupled (e.g., shorted) to each other). Access lines 241, 242, and 243 can be selectively activated (e.g., activated one at a time) during an operation (e.g., read or write operation) of memory device 200 to access a selected memory cell (or selected memory cells) among memory cells 210 through 215. A selected cell can be referred to as a target cell. In a read operation, information can be read from a selected memory cell (or selected memory cells). In a write operation, information can be stored in a selected memory cell (or selected memory cells).

In memory device 200, a single access line (e.g., a single word line) can be used to control (e.g., turn on or turn off) transistors T1 and T2 of a respective memory cell during either a read or write operation of memory device 200. Some conventional memory devices may use multiple (e.g., two separate) access lines to control access to a respective memory cell during read and write operations. In comparison with such conventional memory devices (that use multiple access lines for the same memory cell), memory device 200 uses a single access line (e.g., shared access line) in memory device 200 to control both transistors T1 and T2 of a respective memory cell to access the respective memory cell. This technique can save space and simplify operation of memory device 200. Further, some conventional memory devices may use multiple data lines to access a selected memory cell (e.g., during a read operation) to read information from the selected memory cell. In memory device 200, a single data line (e.g., data line 221 or 222) can be used to access a selected memory cell (e.g., during a read operation) to read information from the selected memory cell. This may also simplify the structure, operation, or both of memory device 200 in comparison with conventional memory devices use multiple data lines to access a selected memory cell.

In memory device 200, the gate of each of transistors T1 and T2 can be part of a respective access line (e.g., a respective word line). As shown in FIG. 2, the gate of each of transistors T1 and T2 of memory cell 210 can be part of access line 241. The gate of each of transistors T1 and T2 of memory cell 211 can be part of access line 241. For example, in the structure of memory device 200, four different portions of a conductive material (or materials) that form access line 241 can form the gates (e.g., four gates) of transistors T1 and T2 of memory cell 210 and T2 of memory cell 211, respectively.

The gate of each of transistors T1 and T2 of memory cell 212 can be part of access line 242. The gate of each of transistors T1 and T2 of memory cells 213 can be part of access line 242. For example, in the structure of memory device 200, four different portions of a conductive material (or materials) that form access line 242 can form the gates (e.g., four gates) of transistors T1 and T2 of memory cell 212 and the gates transistors T1 and T2 of memory cell 213, respectively.

The gate of each of transistors T1 and T2 of memory cell 214 can be part of access line 243. The gate of each of transistors T1 and T2 of memory cell 215 can be part of access line 243. For example, in the structure of memory device 200, four different portions of a conductive material (or materials) that form access line 243 can form the gates (e.g., four gates) of transistors T1 and T2 of memory cell 214 and the gates transistors T1 and T2 of memory cell 215, respectively.

Memory device 200 can include data lines (e.g., bit lines) 221 and 222 that can carry respective signals (e.g., bit line signals) BL1 and BL2. During a read operation, memory device 200 can use data line 221 to obtain information read (e.g., sense) from a selected memory cell of memory cell group $201_0$, and data line 222 to read information from a selected memory cell of memory cell group $201_1$. During a write operation, memory device 200 can use data line 221 to provide information to be stored in a selected memory cell of memory cell group $201_0$, and data line 222 to provide information to be stored in a selected memory cell of memory cell group $201_1$.

Memory device 200 can include a ground connection (e.g., ground plate) 297 coupled to each of memory cells 210 through 215. Ground connection 297 can be structured from a conductive plate (e.g., a layer of conductive material) that can be coupled to ground terminal of memory device 200. As an example, ground connection 297 can include a common conductive plate (e.g., formed over the memory cells (e.g., memory cells 210 through 215) of memory device. In this example, the common conductive plate can be formed over the elements (e.g., transistors T1 and T2) of each of the memory cells (e.g., memory cells 210 through 215) of memory device 200.

As shown in FIG. 2, transistor T1 (e.g., the channel region of transistor T1) of a particular memory cell among memory cells 210 through 215 can be electrically coupled to (e.g., directly coupled to) ground connection 297 and electrically coupled to (e.g., directly coupled to) a respective data line (e.g., data line 221 or 222). Thus, a circuit path (e.g., current path) can be formed between a respective data line (e.g., data line 221 or 222) and ground connection 297 through transistor T1 of a selected memory cell during an operation (e.g., a read operation) performed on the selected memory cell.

Memory device 200 can include read paths (e.g., circuit paths). Information read from a selected memory cell during a read operation can be obtained through a read path coupled to the selected memory cell. In memory cell group $201_0$, a read path of a particular memory cell (e.g., memory cell 210, 212, or 214) can include a current path (e.g., read current path) through a channel region of transistor T1 of that particular memory cell, data line 221, and ground connection 297. In memory cell group $201_1$, a read path of a particular memory cell (e.g., memory cell 211, 213, or 215) can include a current path (e.g., read current path) through a channel region of transistor T1 of that particular memory cell, data line 222, and ground connection 297. In the example where transistor T1 is a PFET (e.g., a PMOS), the current in a read path (e.g., during a read operation) can include a hole conduction (e.g., hole conduction in the direction from data line 221 to ground connection 297 through the channel region of transistor T1). Since transistor T1 can be used in a read path to read information from the respective memory cell during a read operation, transistor T1 can be called a read transistor and the channel region of transistor T1 can be called a read channel region.

Memory device 200 can include write paths (e.g., circuit paths). Information to be stored in a selected memory cell during a write operation can be provided to the selected memory cell through a write path coupled to the selected memory cell. In memory cell group $201_0$, a write path of a particular memory cell can include transistor T2 (e.g., can include a write current path through a channel region of transistor T2) of that particular memory cell and data line 221. In memory cell group $201_1$, a write path of a particular memory cell (e.g., memory cell 211, 213, or 215) can include transistor T2 (e.g., can include a write current path through a channel region of transistor T2) of that particular memory cell and data line 222. In the example where transistor T2 is an NFET (e.g., NMOS), the current in a write path (e.g., during a write operation) can include an electron conduction (e.g., electron conduction in the direction from data line 221 to charge storage structure 202 through the channel region of transistor T2). Since transistor T2 can be used in a write path to store information in a respective memory cell during a write operation, transistor T2 can be called a write transistor and the channel region of transistor T1 can be called a write channel region.

Each of transistors T1 and T2 can have a threshold voltage (Vt). Transistor T1 has a threshold voltage Vt1. Transistor T2 has a threshold voltage Vt2. The values of threshold voltages Vt1 and Vt2 can be different (unequal values). For example, the value of threshold voltage Vt2 can be greater than the value of threshold voltage Vt1. The difference in values of threshold voltages Vt1 and Vt2 allows reading (e.g., sensing) of information stored in charge storage structure 202 in transistor T1 on the read path during a read operation without affecting (e.g., without turning on) transistor T2 on the write path (e.g., path through transistor T2). This can prevent leaking of charge (e.g., during a read operation) from charge storage structure 202 through transistor T2 of the write path.

In a structure of memory device 200, transistors T1 and T2 can be formed (e.g., engineered) such that threshold voltage Vt1 of transistor T1 can be less than zero volts (e.g., Vt1<0V) regardless of the value (e.g., "0" or "1") of information stored in charge storage structure 202 of transistor T1, and Vt1<Vt2. Charge storage structure 202 can be in state "0" when information having a value of "0" is stored in charge storage structure 202. Charge storage structure 202 can be in state "1" when information having a value of "1" is stored in charge storage structure 202. Thus, in this structure, the relationship between the values of threshold voltages Vt1 and Vt2 can be expressed as follows: Vt1 for state "0"<Vt1 for state "1"<0V, and Vt2=0V (or alternatively Vt2>0V).

In an alternative structure of memory device 200, transistors T1 and T2 can be formed (e.g., engineered) such that Vt1 for state "0"<Vt1 for state "1," where Vt1 for state "0"<0V (or alternatively Vt1 for state "0"=0V), Vt1 for state "1">0V, and Vt1<Vt2.

In another alternative structure, transistors T1 and T2 can be formed (e.g., engineered) such that Vt1 (for state "0") <Vt1 (for state "1"), where Vt1 for state "0"=0V (or alternatively Vt1 for state "0">0V, and Vt1<Vt2.

During a read operation of memory device 200, only one memory cell of the same memory cell group can be selected at a time to read information from the selected memory cell. For example, memory cells 210, 212, and 214 of memory cell group $201_0$ can be selected one at a time during a read operation to read information from the selected memory cell (e.g., one of memory cells 210, 212, and 214 in this example). In another example, memory cells 211, 213, and 215 of memory cell group $201_1$ can be selected one at a time during a read operation to read information from the selected memory cell (e.g., one of memory cells 211, 213, and 215 in this example).

During a read operation, memory cells of different memory cell groups (e.g., memory cell groups $201_0$ and $201_1$) that share the same access line (e.g., access line 241, 242, or 243) can be concurrently selected (or alternatively can be sequentially selected). For example, memory cells 210 and 211 can be concurrently selected during a read operation to read (e.g., concurrently read) information from memory cells 210 and 211. Memory cells 212 and 213 can be concurrently selected during a read operation to read (e.g., concurrently read) information from memory cells 212 and 213. Memory cells 214 and 215 can be concurrently selected during a read operation to read (e.g., concurrently read) information from memory cells 214 and 215.

The value of information read from the selected memory cell of memory cell group $201_0$ during a read operation can be determined based on the value of a current detected (e.g. sensed) from a read path (described above) that includes data line 221, transistor T1 of the selected memory cell (e.g., memory cell 210, 212, or 214), and ground connection 297. The value of information read from the selected memory cell of memory cell group $201_1$ during a read operation can be determined based on the value of a current detected (e.g. sensed) from a read path that includes data line 222, transistor T1 of the selected memory cell (e.g., memory cell 211, 213, or 215), and ground connection 297.

Memory device 200 can include detection circuitry (not shown) that can operate during a read operation to detect (e.g., sense) a current (e.g., current I1, not shown) on a read path that includes data line 221 and detect a current (e.g., current I2, not shown) on a read path that includes data line 222. The value of the detected current can be based on the value of information stored in the selected memory cell. For example, depending on the value of information stored in the selected memory cell of memory cell group $201_0$, the value of the detected current (e.g., the value of current I1) on data line 221 can be zero or greater than zero. Similarly, depending on the value of information stored in the selected memory cell of memory cell group $201_1$, the value of the detected current (e.g., the value of current I2) between data line 222 can be zero or greater than zero. Memory device 200 can include circuitry (not shown) to translate the value of a detected current into the value (e.g., "0", "1", or a combination of multi-bit values) of information stored in the selected memory cell.

During a write operation of memory device 200, only one memory cell of the same memory cell group can be selected at a time to store information in the selected memory cell. For example, memory cells 210, 212, and 214 of memory cell group $201_0$ can be selected one at a time during a write operation to store information in the selected memory cell (e.g., one of memory cell 210, 212, and 214 in this example). In another example, memory cells 211, 213, and 215 of memory cell group $201_1$ can be selected one at a time during a write operation to store information in the selected memory cell (e.g., one of memory cell 211, 213, and 215 in this example).

During a write operation, memory cells of different memory cell groups (e.g., memory cell groups $201_0$ and $201_1$) that share the same access line (e.g., access line 241, 242, or 243) can be concurrently selected. For example, memory cells 210 and 211 can be concurrently selected during a write operation to store (e.g., concurrently store) information in memory cells 210 and 211. Memory cells 212 and 213 can be concurrently selected during a write operation to store (e.g., concurrently store) information in memory cells 212 and 213. Memory cells 214 and 215 can be concurrently selected during a write operation to store (e.g., concurrently store) information in memory cells 214 and 215.

Information to be stored in a selected memory cell of memory cell group $201_0$ during a write operation can be provided through a write path (described above) that includes data line 221 and transistor T2 of the selected memory cell (e.g., memory cell 210, 212, or 214). Information to be stored in a selected memory cell of memory cell group $201_1$ during a write operation can be provided through a write path (described above) that includes data line 222 and transistor T2 of the selected memory cell (e.g., memory cell 211, 213, or 215). As described above, the value (e.g., binary value) of information stored in a particular memory cell among memory cells 210 through 215 can be based on the amount of charge in charge storage structure 202 of that particular memory cell.

In a write operation, the amount of charge in charge storage structure 202 of a selected memory cell can be changed (to reflect the value of information stored in the selected memory cell) by applying a voltage on a write path that includes transistor T2 of that particular memory cell and the data line (e.g., data line 221 or 222) coupled to that particular memory cell. For example, a voltage having one value (e.g., 0V) can be applied on data line 221 (e.g., provide 0V to signal BL1) if information to be stored in a selected memory cell among memory cells 210, 212, and 214 has one value (e.g., "0"). In another example, a voltage having another value (e.g., a positive voltage) can be applied on data line 221 (e.g., provide a positive voltage to signal BL1) if information to be stored in a selected memory cell among memory cells 210, 212, and 214 has another value (e.g., "1"). Thus, information can be stored (e.g., directly stored) in charge storage structure 202 of a particular memory cell by providing the information to be stored (e.g., in the form of a voltage) on a write path (that includes transistor T2) of that particular memory cell.

Figure 3:
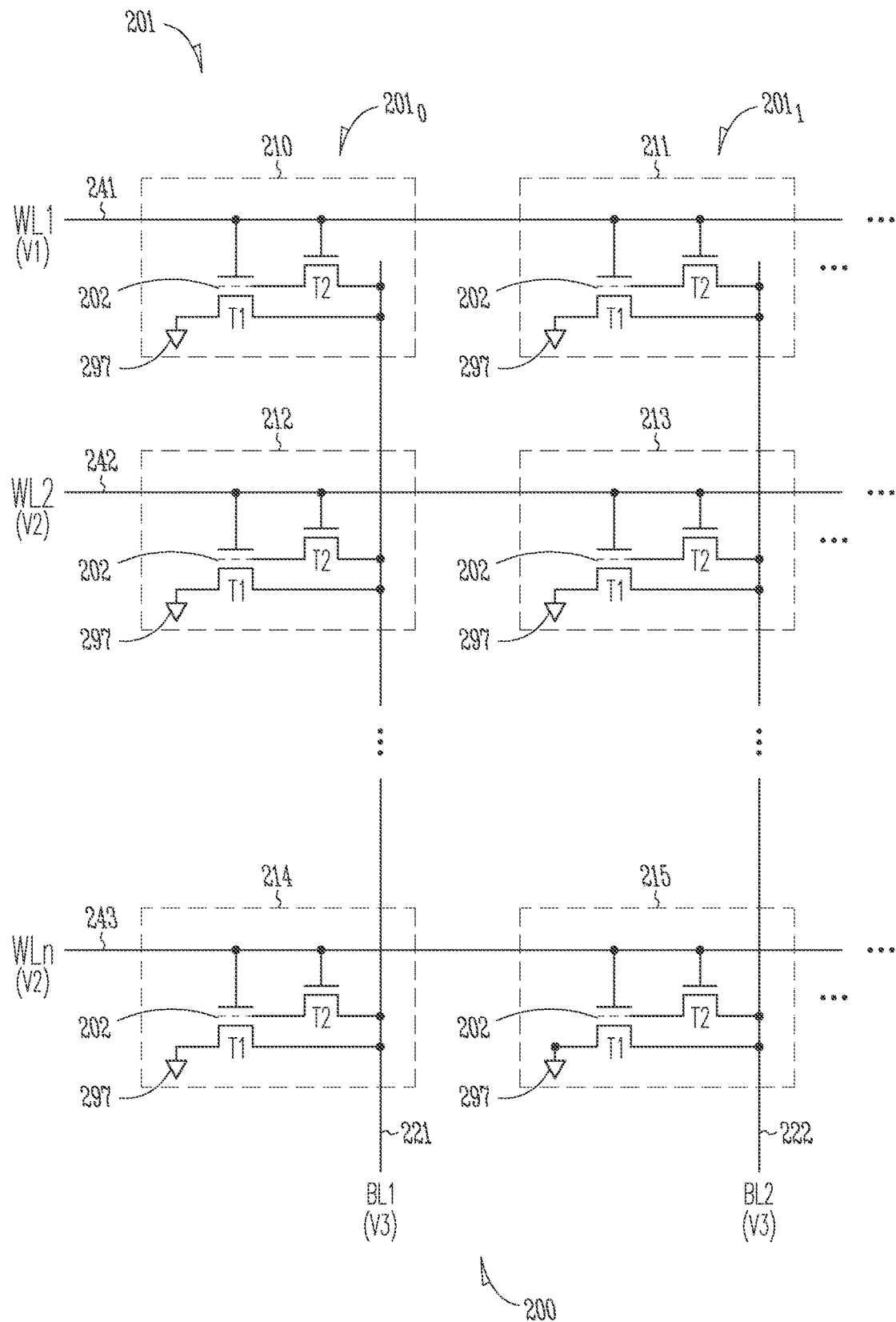
FIG. 3 shows the memory device of FIG. 2, including example voltages used during a read operation of the memory device, according to some embodiments described herein.

FIG. 3 shows memory device 200 of FIG. 2 including example voltages V1, V2, and V3 used during a read operation of memory device 200, according to some embodiments described herein. The example of FIG. 3 assumes that memory cells 210 and 211 are selected memory cells (e.g., target memory cells) during a read operation to read (e.g., to sense) information stored (e.g., previously stored) in memory cells 210 and 211. Memory cells 212 through 215 are assumed to be unselected memory cells. This means that memory cells 212 through 215 are not accessed and information stored in memory cells 212 through 215 are not read while information is read from memory cells 210 and 211 in the example of FIG. 3.

In FIG. 3, voltages V1, V2, and V3 can represent different voltages applied to respective access lines 241, 242, and 243, and data lines 221 and 222 during a read operation of memory device 200. As an example, voltages V1, V2, and V3 can have values −1V, 0V, and 0.5V, respectively. The specific values of voltages used in this description are only example values. Different values may be used. For example, voltage V1 can have a negative value range (e.g., the value of voltage V1 can be from −3V to −1V).

In the read operation shown in FIG. 3, voltage V1 can have a value (voltage value) to turn on transistor T1 of each of memory cells 210 and 211 (selected memory cells in this example) and turn off (or keep off) transistor T2 of each of memory cells 210 and 211. This allows information to be read from memory cells 210 and 211. Voltage V2 can have a value such that transistors T1 and T2 of each of memory cells 212 through 215 (unselected memory cells in this example) are turned off (e.g., kept off). Voltage V3 can have a value such that a current (e.g., read current) may be formed on a read path that includes data line 221 and transistor T1 of memory cell 210, and a read path (a separate read path) that includes data line 222 and transistor T1 of memory cell 212. This allows a detection of current on the read paths coupled to memory cells 210 and 211, respectively. A detection circuitry (not shown) of memory device 200 can operate to translate the value of the detected current (during reading of information from the selected memory cells) into the value (e.g., "0", "1", or a combination of multi-bit values) of information read from the selected memory cell. In the example of FIG. 3, the value of the detected currents on data lines 221 and 222 can be translated into the values of information read from memory cells 210 and 211, respectively.

In the read operation shown in FIG. 3, the voltages applied to respective access lines 241, 242, and 243 can cause transistors T1 and T2 of each of memory cells 212 through 215, except transistor T1 of each of memory cells 210 and 211 (selected memory cells), to turn off (or to remain turned off). Transistor T1 of memory cell 210 (selected memory cell) may or may not turn on, depending on the value of the threshold voltage Vt1 of transistor T1 of memory cell 210. Transistor T1 of memory cell 211 (selected memory cell) may or may not turn on, depending on the value of the threshold voltage Vt1 of transistor T1 of memory cell 211. For example, if transistor T1 of each of memory cells (e.g., 210 through 215) of memory device 200 is configured (e.g., structured) such that the threshold voltage of transistor T1 is less than zero (e.g., Vt1<−1V) regardless of the value (e.g., the state) of information stored in a respective memory cell 210, then transistor T1 of memory cell 210, in this example, can turn on and conduct a current on data line 221 (through transistor T1 of memory cell 210). In this example, transistor T1 of memory cell 211 can also turn on and conduct a current on data line 222 (through transistor T1 of memory cell 211). Memory device 200 can determine the value of information stored in memory cells 210 and 211 based on the value of the currents on data lines 221 and 222, respectively. As described above, memory device 200 can include detection circuitry to measure the value of currents on data lines 221 and 222 during a read operation.

Figure 4:
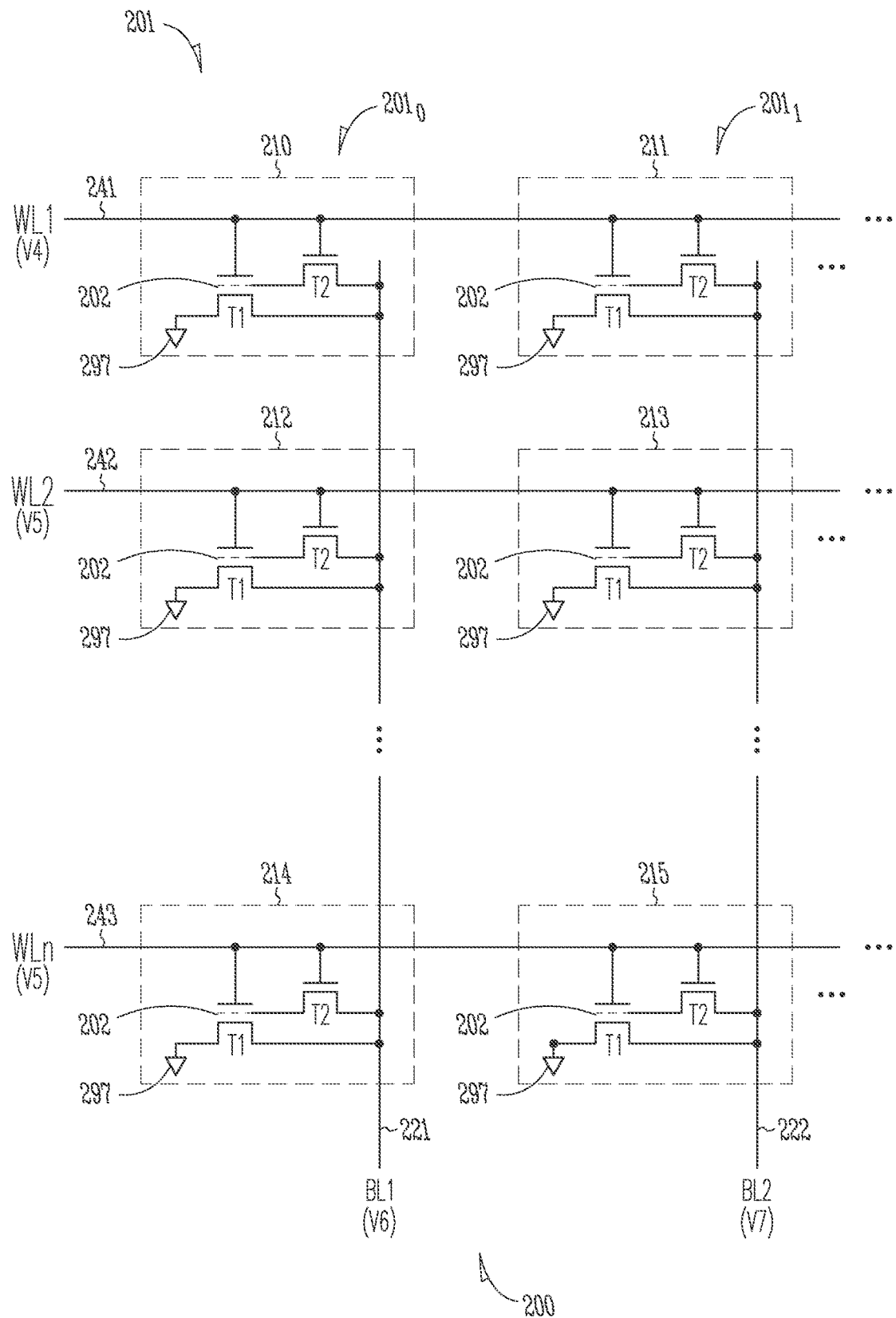
FIG. 4 shows the memory device of FIG. 2, including example voltages used during a write operation of the memory device, according to some embodiments described herein.

FIG. 4 shows memory device 200 of FIG. 2 including example voltages V4, V5, V6, and V7 used during a write operation of memory device 200, according to some embodiments described herein. The example of FIG. 4 assumes that memory cells 210 and 211 are selected memory cells (e.g., target memory cells) during a write operation to store information in memory cells 210 and 211. Memory cells 212 through 215 are assumed to be unselected memory cells. This means that memory cells 212 through 215 are not accessed and information is not to be stored in memory cells 212 through 215 while information is stored in memory cells 210 and 211 in the example of FIG. 4.

In FIG. 4, voltages V4, V5, V6, and V7 can represent different voltages applied to respective access lines 241, 242, and 243, and data lines 221 and 222 during a write operation of memory device 200. As an example, voltages V4 and V5 can have values of 3V and 0V, respectively. These values are example values. Different values may be used.

The values of voltages V6 and V7 can be the same or different depending on the value (e.g., "0" or "1") of information to be stored in memory cells 210 and 211. For example, the values of voltages V6 and V7 can be the same (e.g., V6=V7) if the memory cells 210 and 211 are to store information having the same value. As an example, V6=V7=0V if information to be stored in each memory cell 210 and 211 is "0", and V6=V7=1V to 3V if information to be stored in each memory cell 210 and 211 is "1").

In another example, the values of voltages V6 and V7 can be different (e.g., V6≠V7) if the memory cells 210 and 211 are to store information having different values. As an example, V6=0V and V7=1V to 3V if "0" is to be stored in memory cell 210 and "1" is to be stored in memory cell 211. As another example, V6=1V to 3V and V7=0V if "1" is to be stored in memory cell 210 and "0" is to be stored in memory cell 211.

The range of voltage of 1V to 3V is used here as an example. A different range of voltages can be used. Further, instead of applying 0V (e.g., V6=0V or V7=0V) to a particular write data line (e.g., data line 221 or 222) for storing information having a value of "0" to the memory cell (e.g., memory cell 210 or 211) coupled to that particular write data line, a positive voltage (e.g., V6>0V or V7>0V) may be applied to that particular data line.

In a write operation of memory device 200 of FIG. 4, voltage V5 can have a value, such that transistors T1 and T2 of each of memory cells 212 through 215 (unselected memory cells, in this example) are turned off (e.g., kept off). Voltage V4 can have a value to turn on transistor T2 of each of memory cells 210 and 211 (selected memory cells in this example) and form a write path between charge storage structure 202 of memory cell 210 and data line 221, and a write path between charge storage structure 202 of memory cell 211 and data line 222. A current (e.g., write current) may be formed between charge storage structure 202 of memory cell 210 (selected memory cell) and data line 221. This current can affect (e.g., change) the amount of charge on charge storage structure 202 of memory cell 210 to reflect the value of information to be stored in memory cell 210. A current (e.g., another write current) may be formed between charge storage structure 202 of memory cell 211 (selected memory cell) and data line 222. This current can affect (e.g., change) the amount of charge on charge storage structure 202 of memory cell 211 to reflect the value of information to be stored in memory cell 211.

In the example write operation of FIG. 4, the value of voltage V6 may cause charge storage structure 202 of memory cell 210 to discharge or to be charged, such that the resulting charge (e.g., charge remaining after the discharge or charge action) on charge storage structure 202 of memory cell 210 can reflect the value of information stored in memory cell 210. Similarly, the value of voltage V7 in this example may cause charge storage structure 202 of memory cell 211 to discharge or to be charged, such that the resulting charge (e.g., charge remaining after the discharge or charge action) on charge storage structure 202 of memory cell 211 can reflect the value of information stored in memory cell 211.

As described above with reference to FIG. 2 through FIG. 4, the connection and structure of memory device 200 can allow a cross-point operation (which can simplify operation of memory device 200) in that a memory cell (e.g. memory cell 210) of memory device 200 can be accessed using a single access line (e.g., access line 241) and a single data line (e.g., data line 221) during an operation (e.g., a read or write operation) of memory device 200. Such a cross-point operation can be achieved due in part to a terminal (e.g., a source terminal) of transistor T1 of each of the memory cells (e.g., memory cell 210 through 215) being coupled to a ground connection. This ground connection allows a voltage level at a terminal (e.g., source terminal) of transistor T1 of a selected memory cell to remain unchanged (e.g., remain unswitched at 0V), thereby allowing the cross-point operation. The cross-point operation and the structure of memory device 200 can provide better memory performance in comparison with some conventional volatile memory devices (e.g., DRAM devices).

FIG. 5 shows memory device 200 including additional memory cells 208 and 209 in the Y-direction with respect to memory cells 210 and 211, respectively. As shown in FIG. 5, memory cells 208 and 209 can share the same access line (e.g., access line 241) with memory cells 210 and 211. Thus, the same access line (e.g., access line 241) can be used to access memory cells 208, 209, 210, and 211 during an operation (e.g., read or write operation) of memory device 200. Although not shown in FIG. 5, memory device 200 also includes memory cells (not shown, but can be similar to memory cells 208 and 209) sharing access line 242 with memory cells 212 and 213 and memory cells (not shown, but can be similar to memory cells 208 and 209) sharing access line 243 with memory cells 212 and 213.

The physical structure of memory device 200 of FIG. 5 can include multiple levels (e.g., multiple decks) of memory cells where one level (e.g., one deck) of memory cells can be formed over (e.g., stacked on) another level (e.g., another deck) of additional memory cells. For example, memory cells 208, 209, 210, and 211 can be included in one deck (e.g., deck one), memory cells 212 and 213 can be included in another deck (e.g., deck two under (below) deck one), and memory cells 214 and 215 can be included in another deck (e.g., deck three under deck two).

The structure (e.g., multi-deck structure) of memory device 200 of FIG. 5 can include the structures of the memory devices described below with reference to FIG. 6 through FIG. 18.

Figure 6:
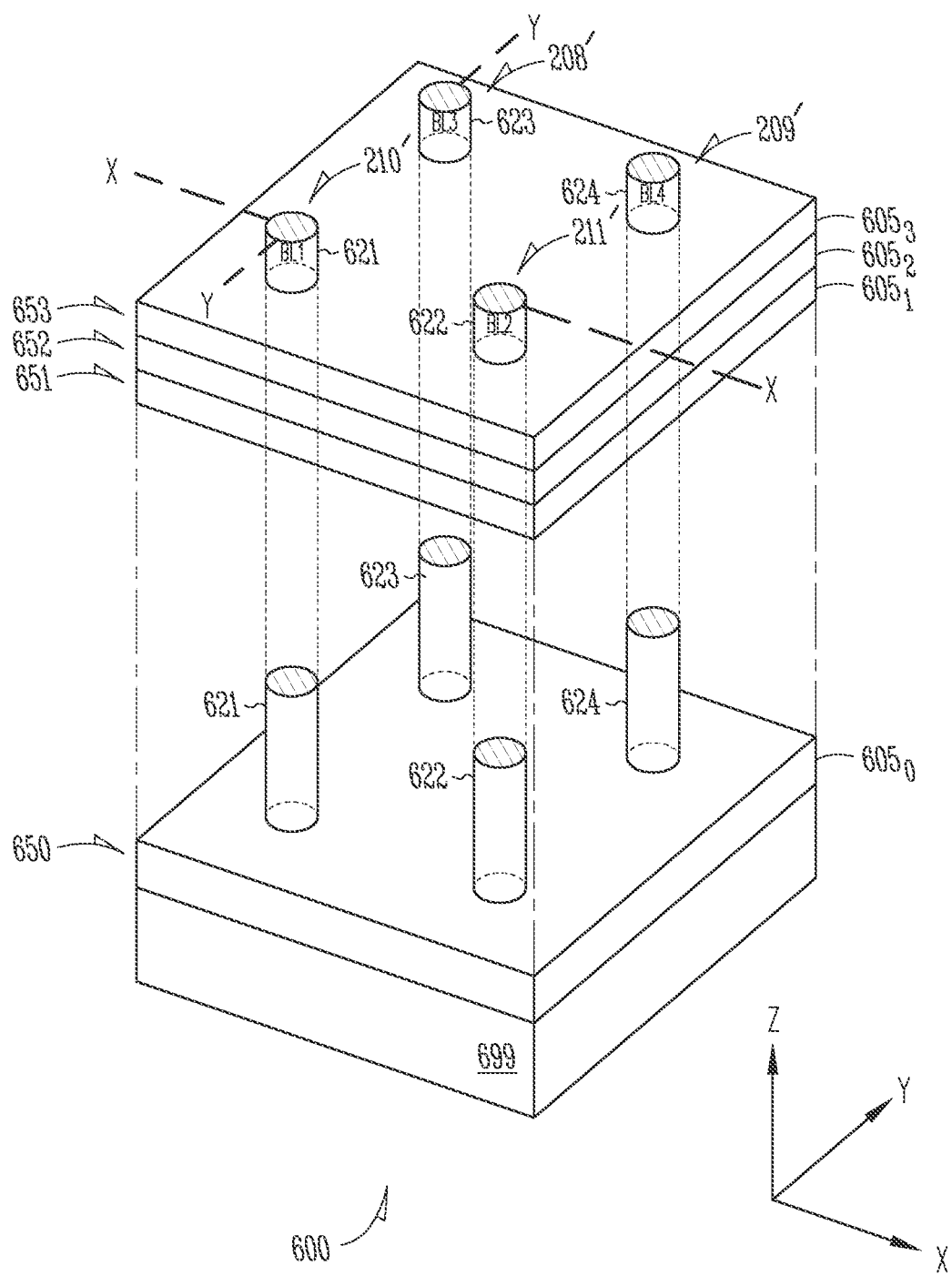
FIG. 6 through FIG. 12 show different views of a structure of a memory device including multiple decks of memory cells, according to some embodiments described herein.

FIG. 6 shows a structure of a memory device 600 including multiple decks (decks of memory cells) decks $605_0$, $605_1$, $605_2$, and $605_3$, according to some embodiments described herein. The X, Y, and Z directions shown in FIG. 6 can represent the directions corresponding to a three-dimensional (3-D) structure of memory device 600. As shown in FIG. 6, memory device 600 can include a substrate 699 over which decks $605_0$, $605_1$, $605_2$, and $605_3$ can be formed. Substrate 699 can be a semiconductor substrate (e.g., silicon-based substrate) or other types of substrates. The Z-direction (e.g., vertical direction) is a direction perpendicular to (e.g., outward from) substrate 699. The Z-direction is also perpendicular to (e.g., extended vertically from) an X-direction and a Y-direction. The X-direction and Y-direction are perpendicular to each other. FIG. 6 shows memory device 600 including four decks $605_0$, $605_1$, $605_2$, and $605_3$ as an example. The number of decks of memory device 600 can vary.

As shown in FIG. 6, memory device 600 can include levels (e.g., different vertical levels) 650, 651, 652, and 653 with respect to the Z-direction. Decks $605_0$, $605_1$, $605_2$, and $605_3$ can be located in (formed in) levels 650, 651, 652, and 653, respectively.

Memory device 600 can include data lines (e.g., vertical bit lines) 621, 622, 623, and 624 that are electrically separated (isolated) from each other. FIG. 6 shows four data lines 621, 622, 623, and 624 as an example. The number of data lines of memory device 600 can vary. Each of data lines (e.g., bit lines) 621, 622, 623, and 624 can be formed from a conductive material (e.g., conductively doped polysilicon, metal, or other conductive materials). The conductive material of each of data lines 621, 622, 623, and 624 can have a pillar structure that extends perpendicularly from substrate 699.

Each of data lines 621, 622, 623, and 624 can have a length extending (e.g., extending vertically) in the Z-direction, which is a direction perpendicular to (outward from) substrate 699. The length of each of data lines 621, 622, 623, and 624 can extend from one deck to another deck (e.g., extend through decks $605_0$, $605_1$, $605_2$, and $605_3$). Data lines 621, 622, 623, and 624 can correspond to data lines 221, 222, 223, and 224 of memory device 200 of FIG. 5.

As shown in FIG. 6, deck $605_3$ can include memory cells 208', 209', 210', and 211' that can correspond to memory cells 208, 209, 210, and 211, respectively. In FIG. 6, data lines 221, 222, 223, and 224 can be electrically coupled to memory cells 208', 209', 210', and 211', respectively. Other decks $605_0$, $605_1$, and $605_2$ can also include memory cells (not labeled) located along the length data lines 221, 222, 223, and 224 and located under (below) respective memory cells 208', 209', 210', and 211', respectively, of deck $605_3$. FIG. 6 shows four memory cells in each of decks $605_0$, $605_1$, $605_2$, and $605_3$ (e.g., four memory cells 208', 209', 210', and 211' in deck $605_3$) as an example. However, the number of memory cells in decks $605_0$, $605_1$, $605_2$, and $605_3$ of deck $605_3$ can vary.

Figure 7:
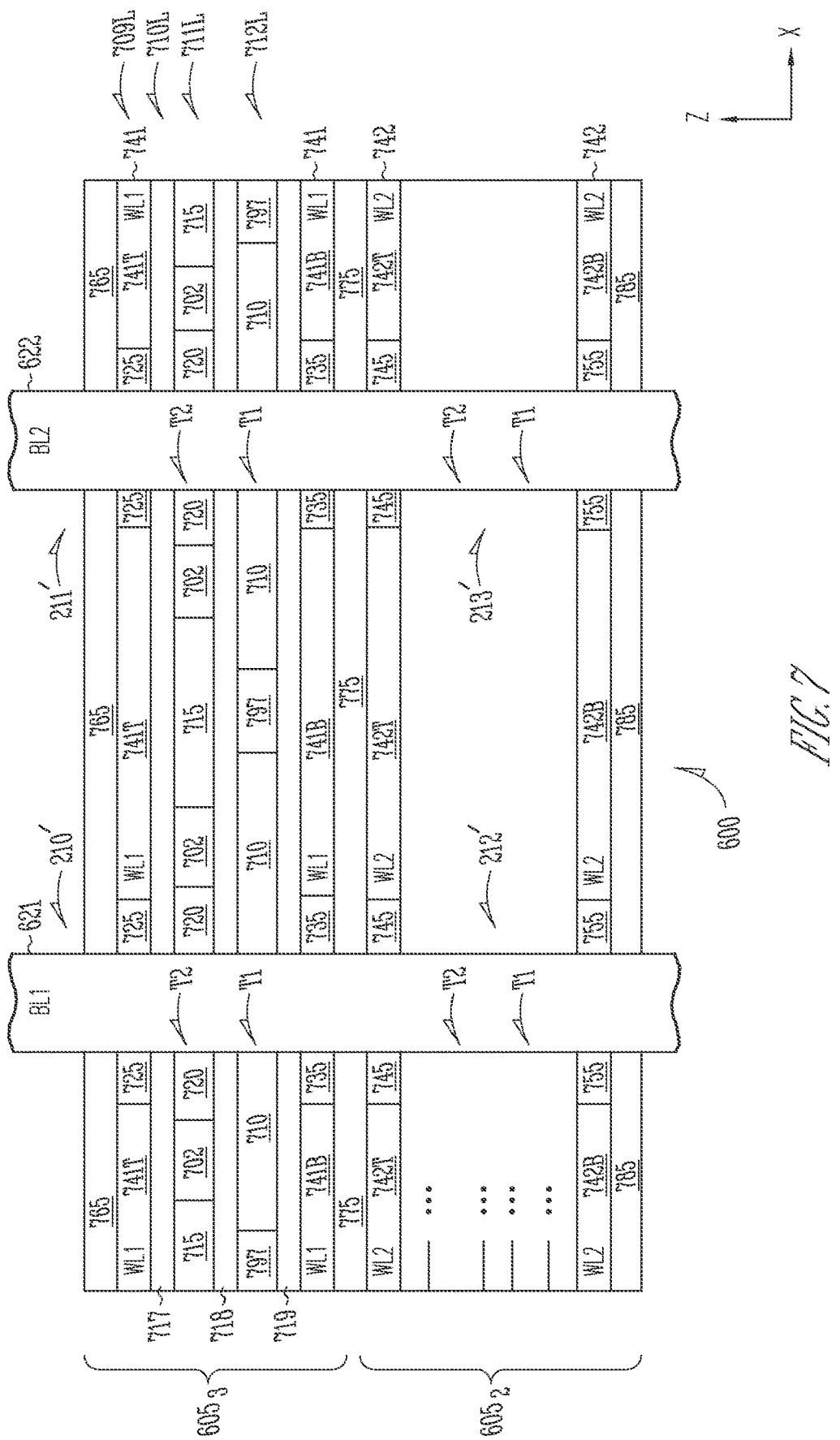
Figure 8:
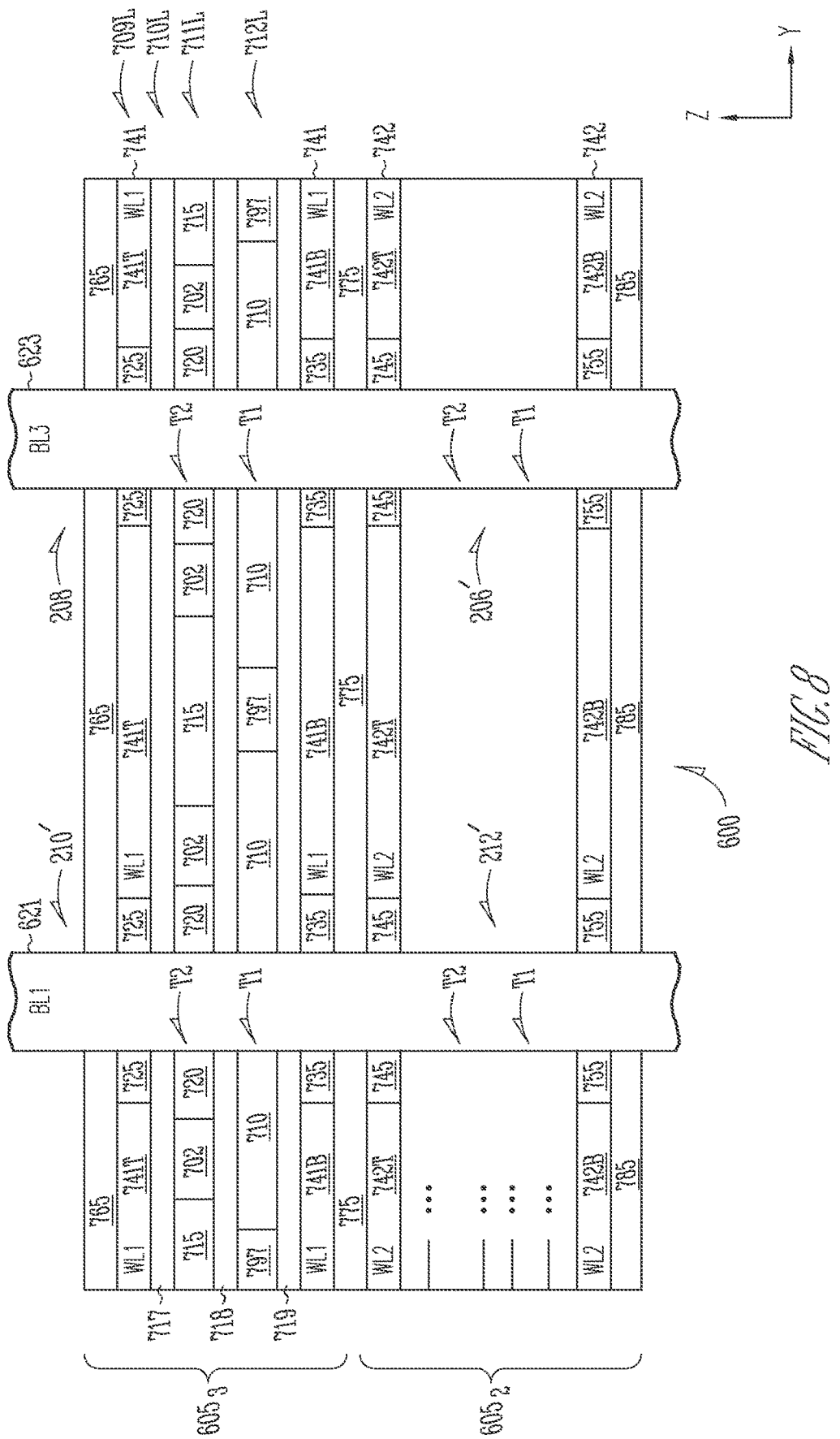

In FIG. 6, line X-X and line Y-Y indicates locations of sections (e.g., a cross-sectional views) of a portion of memory device 600 shown in FIG. 7 and FIG. 8, respectively. For simplicity, the description of FIG. 7 and FIG. 8 concentrates on details of the elements of deck $605_3$. Deck $605_2$ (and other decks) of memory device 1300 can have similar elements.

FIG. 7 shows a view (e.g., cross-sectional view) of a portion of memory device 600 taken along line X-X of FIG. 6. FIG. 8 shows a view (e.g., cross-sectional view) of a portion of memory device 600 taken along line Y-Y of FIG. 6. As shown in FIG. 7 and FIG. 8, deck $605_3$ can include levels (e.g., different layers of materials) 709L, 719L, 711L, and 712L. FIG. 9, FIG. 10, FIG. 11, and FIG. 12 show perspective views (e.g., 3-D views) of levels 709L, 719L 711L, and 712L, respectively. In FIG. 6 through FIG. 12, the same elements are given the same reference numbers.

The following description refers to FIG. 7 through FIG. 12 (details of deck $605_3$ and some details of deck $605_2$). For simplicity, detailed description of the same element is not repeated in the description of FIG. 7 through FIG. 12. Also for simplicity, cross-sectional lines (e.g., hatch lines) are omitted from most of the elements shown in FIG. 7 through FIG. 12 and other figures described herein. Some elements of memory device 600 may be omitted from a particular figure of the drawings so as to not obscure the description of the element (or elements) being described in that particular figure. The dimensions (e.g., physical structures) of the elements shown in the drawings described herein are not scaled.

FIG. 7 shows a cross-sectional view of decks $605_3$ and $605_2$ taken along line X-X of FIG. 6. As shown in FIG. 7, each of data lines 621 and 622 can extend in the Z-direction and can be electrically coupled to some of the elements (e.g., read and write channel regions of respective transistors T1 and T2, described below) of respective memory cells among memory cells 210' and 211' of deck $605_3$ and memory cells 212' and 213' of deck $605_2$. Each of data lines 621 and 622 can be electrically separated from the access lines (e.g., access lines 741 and 742) of memory device 600.

FIG. 8 shows a cross-sectional view of decks $605_3$ and $605_2$ taken along line Y-Y of FIG. 6. A portion of memory device 600 shown in FIG. 8 is the same as a portion of memory device 600 shown in FIG. 7. For example, data line 621 and memory cells 210' and 212' of FIG. 7 and FIG. 8 are the same. As shown in FIG. 8, data line 623 can be electrically coupled to some of the elements (e.g., read and write channel regions of respective transistors T1 and T2) of respective memory cells of decks $605_3$ and $605_2$ (e.g., memory cell 208' of deck $605_3$ and memory cell 206' of deck $605_2$).

The following description with reference to FIG. 7 through FIG. 12 describes some details (in 3-D views) of levels 709L, 719L 711L, and 712L, respectively, of memory device 1300 shown in FIG. 7. In each of FIG. 9, FIG. 10, FIG. 11, and FIG. 12, lines X-X and Y-Y indicate corresponding locations of cross-sectional views of levels 709L, 719L 711L, and 712L of memory device 1300 of FIG. 7 and FIG. 8, respectively. Each of FIG. 9 through FIG. 12 also shows relative locations of memory cells 208', 209', 210', and 211' of deck $605_3$ of memory device 600 of FIG. 6.

For simplicity, the description of FIG. 7 through FIG. 12 concentrates on the elements of deck $605_3$. Deck $605_2$ can have similar elements (which are not shown in details in FIG. 7 through FIG. 12).

Figure 9:
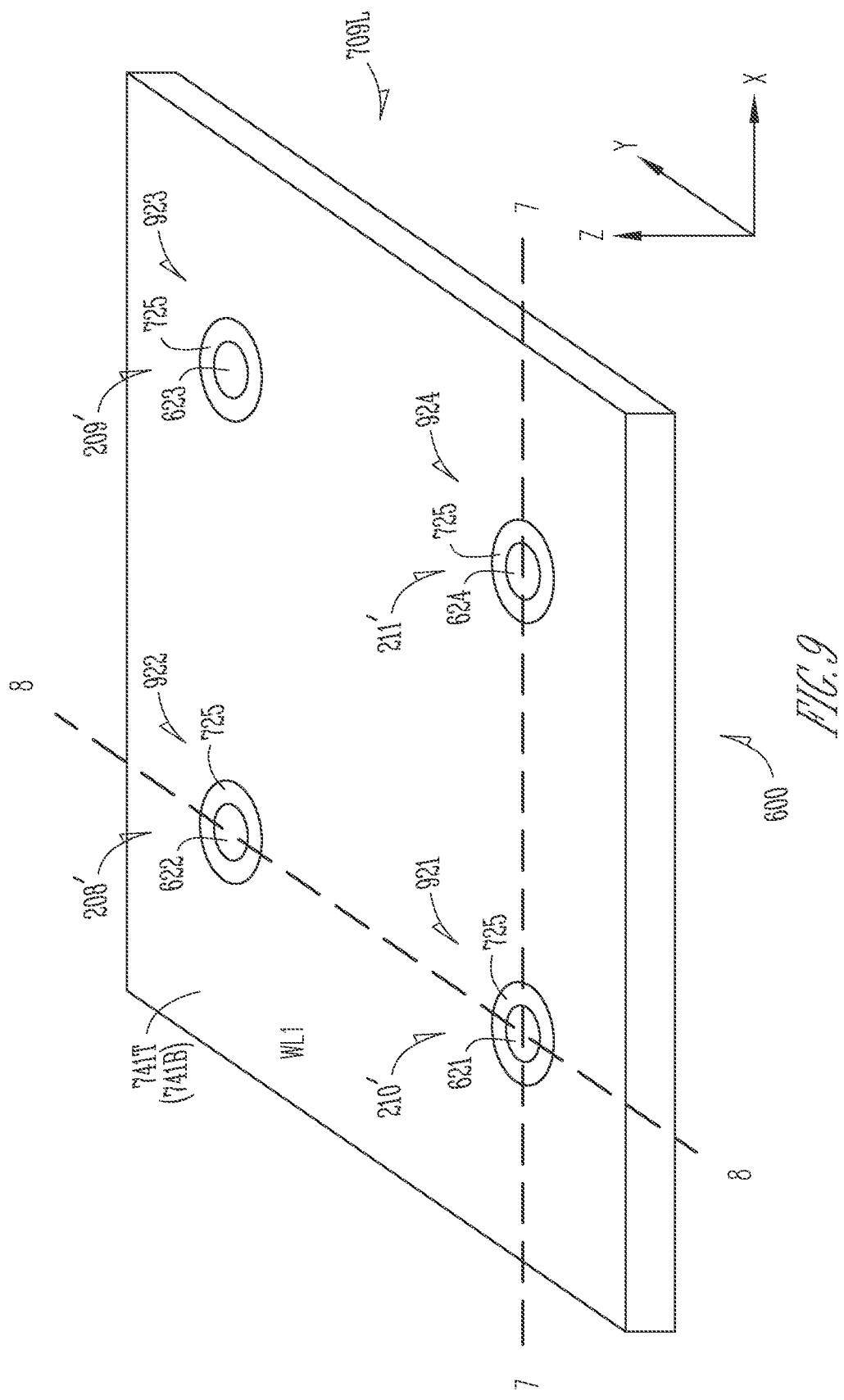

As shown in FIG. 7 and FIG. 9, memory device 600 can include an access line 741 (e.g., word line), which can correspond to access line 241 of memory device 200 of FIG. 5. Access line 741 can receive a signal (e.g., word line signal) WL1 to control (e.g., turn on or turn off) transistors T1 and T2 of the memory cells (e.g., memory cells 208', 209', 210', and 211' in FIG. 6) of deck $605_3$.

Access line 741 can be formed by a conductive region (e.g., conductive plate) 741T and a conductive region (e.g., conductive plate) 741B. Conductive regions 741T and 741B can be referred to as top and bottom conductive regions (top and bottom portions), respectively, of access line 741. Each of conductive regions 741T and 741B can include a conductive material (e.g., conductively doped polysilicon, metal, or other conductive materials). Memory device 600 can include a conductive connection (not shown) to electrically couple conductive region 741T to conductive region 741B.

Memory device 600 can include dielectrics 725 and dielectrics 735. Conductive region 741T can be electrically separated from data lines 621 and 622 by a respective dielectric among dielectrics 725. Conductive region 741B is electrically separated from data lines 621 and 622 by a respective dielectric among dielectrics 735.

As shown in FIG. 9, conductive region 741T can have a plate structure (e.g., conductive plate structure) with openings (e.g., a mesh structure). Thus, conductive region 741T shown in FIG. 7 can be part of a conductive plate shown in FIG. 12. Level 709L of memory device 600 can include openings (e.g., spaces) 921, 922, 923, and 924 at conductive region 741T (e.g., top conductive region of the access line 741 of deck 605₃) that are void of the material (conductive material) that forms the structure (e.g., conductive plate structure) of conductive region 741T. Each of dielectrics 725 can be located at (e.g., conforming to side walls of) a respective opening among openings 921, 922, 923, and 924. Data lines 621, 622, 623, and 624 can pass through respective dielectrics 725 at the locations of openings 921, 922, 923, and 924. Thus, each of data lines 621, 622, 623, and 624 can be surrounded (and contacted) by dielectric 725 at a respective opening among openings 921, 922, 923, and 924. Therefore, data lines 621, 622, 623, and 624 are electrically separated from conductive region 741T (by respective dielectrics 725). Conductive region 741B (e.g., bottom conductive region of access line 741 of deck 605₃) and dielectrics 735 (FIG. 7) can have a structure similar to that of conductive region 741T and dielectric 725 of FIG. 9.

As shown in FIG. 7, memory device 600 can include an access line 742 (e.g., word line), which can correspond to access line 242 of FIG. 5. Access line 742 can receive a signal (e.g., word line signal) WL2 to control (e.g., turn on or turn off) transistors T1 and T2 of the memory cells (e.g., memory cells 208', 209', 210', and 211' in FIG. 6) of deck 605₃. Access line 742 can be used to control (e.g., turn on or turn off) transistors T1 and T2 of memory cells (e.g., memory cells 212' and 213' in FIG. 7 and memory cell 206' in FIG. 8) of deck 605₂. Access line 742 can include conductive regions 742T and 742B that are electrically separated from data lines 621 and 622 by dielectrics 745 and dielectrics 755, respectively. Conductive region 742T and dielectrics 745 can have a structure similar to that of conductive region 741T and dielectrics 725 of FIG. 9. Conductive region 742B and dielectrics 755 can have a structure similar to that of conductive region 741T and dielectrics 725 of FIG. 9.

As shown in FIG. 7, memory device 600 can include different dielectrics located in different levels in the Z-direction to electrically separate the elements (in the Z-direction) within the same deck and to electrically separate one deck from another deck. For example, as shown in FIG. 7, memory device 600 can include dielectrics 717, 718, 719, 765, 775, and 785. Dielectrics 717, 718, and 719 can electrically separate (in the Z-direction) elements within deck 605₂. Dielectrics 765, 775, and 785 can electrically separate (in the Z-direction) one deck from another deck.

Figure 10:
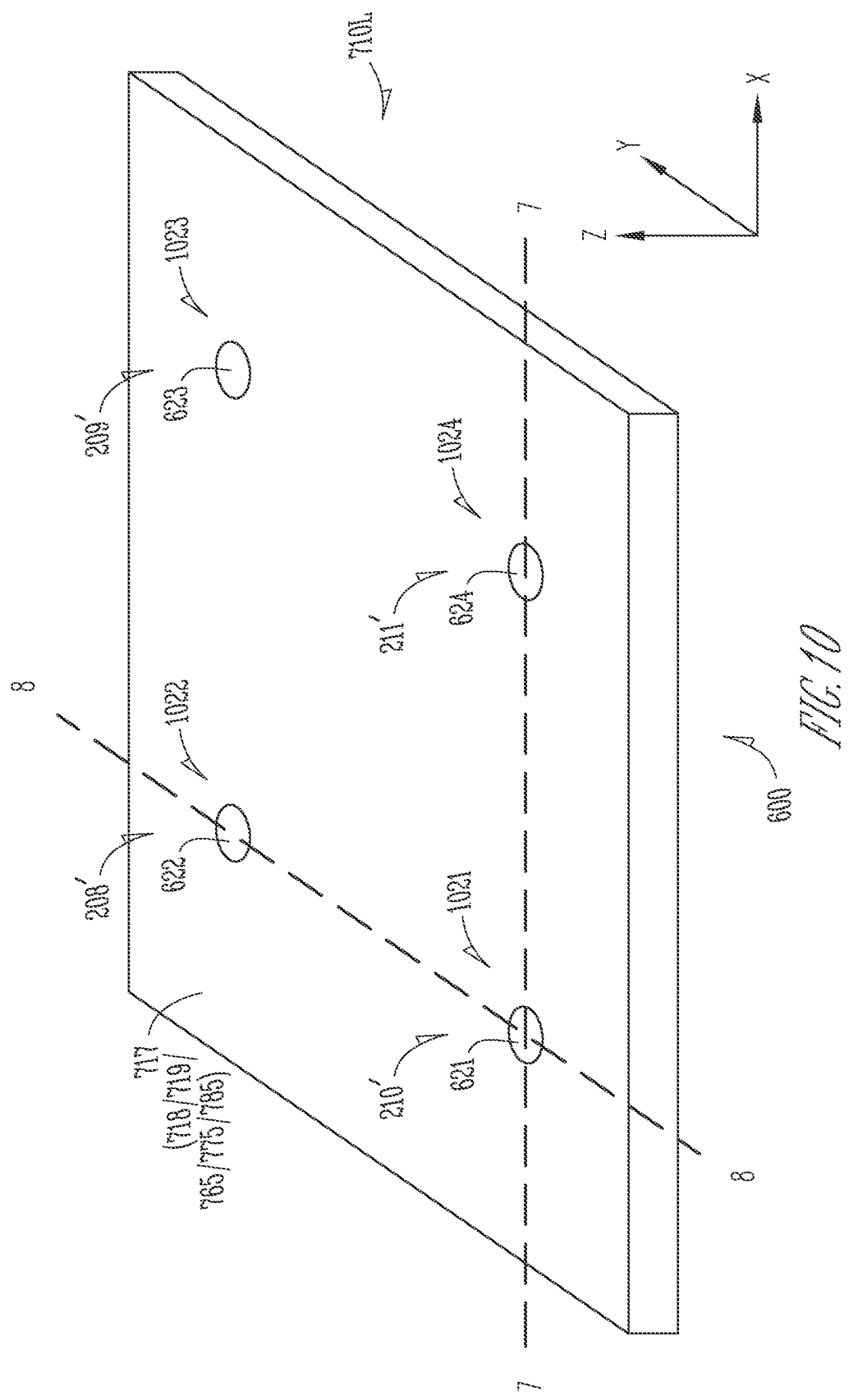

As shown in FIG. 10, dielectric 717 can have a plate structure (e.g., dielectric plate structure) with openings. Thus, dielectric 717 shown in FIG. 7 can be part of a dielectric plate shown in FIG. 10. Level 710L of memory device 600 can include openings (e.g., spaces) 1021, 1022, 1023, and 1024 at dielectric 717 that are void of the material (dielectric material) that forms the structure (e.g., dielectric plate structure) of dielectric 717. Data lines 621, 622, 623, and 624 can pass through (and contact) dielectric 717 at respective openings 1021, 1022, 1023, and 1024 of FIG. 10. Other dielectrics 718, 719, 765, 775, and 785 (FIG. 7) can have a structure similar to that of dielectric 717 of FIG. 10. Two or more of dielectrics 717, 718, 719, 765, 775, and 785 can have the same thickness or different thicknesses. Dielectrics 717, 718, 719, 765, 775, and 785 can have the same dielectric material or different dielectric materials. Example materials for dielectrics 717, 718, 719, 765, 775, and 785 include silicon oxide, silicon nitride, hafnium oxide (e.g., $HfO_2$), aluminum oxide (e.g., $Al_2O_3$), or other dielectric materials.

As shown in FIG. 7, each of memory cells 210' and 211' can include transistor T2, which can include a charge storage structure 702 and a material 720 electrically coupled to charge storage structure 702. Material 720 can be between charge storage structure 702 and a respective data line (e.g., data line 621 or 622). Material 720 can form part of a channel region (e.g., write channel region) of transistor T2 of a respective memory cell (e.g., memory cell 210' or 211'). Material 720 can be electrically coupled to a respective data line (e.g., data line 621 or 622). Memory device 600 can include a dielectric 715, which can include a portion electrically separating memory cells 210' and 211' from each other.

Figure 11:
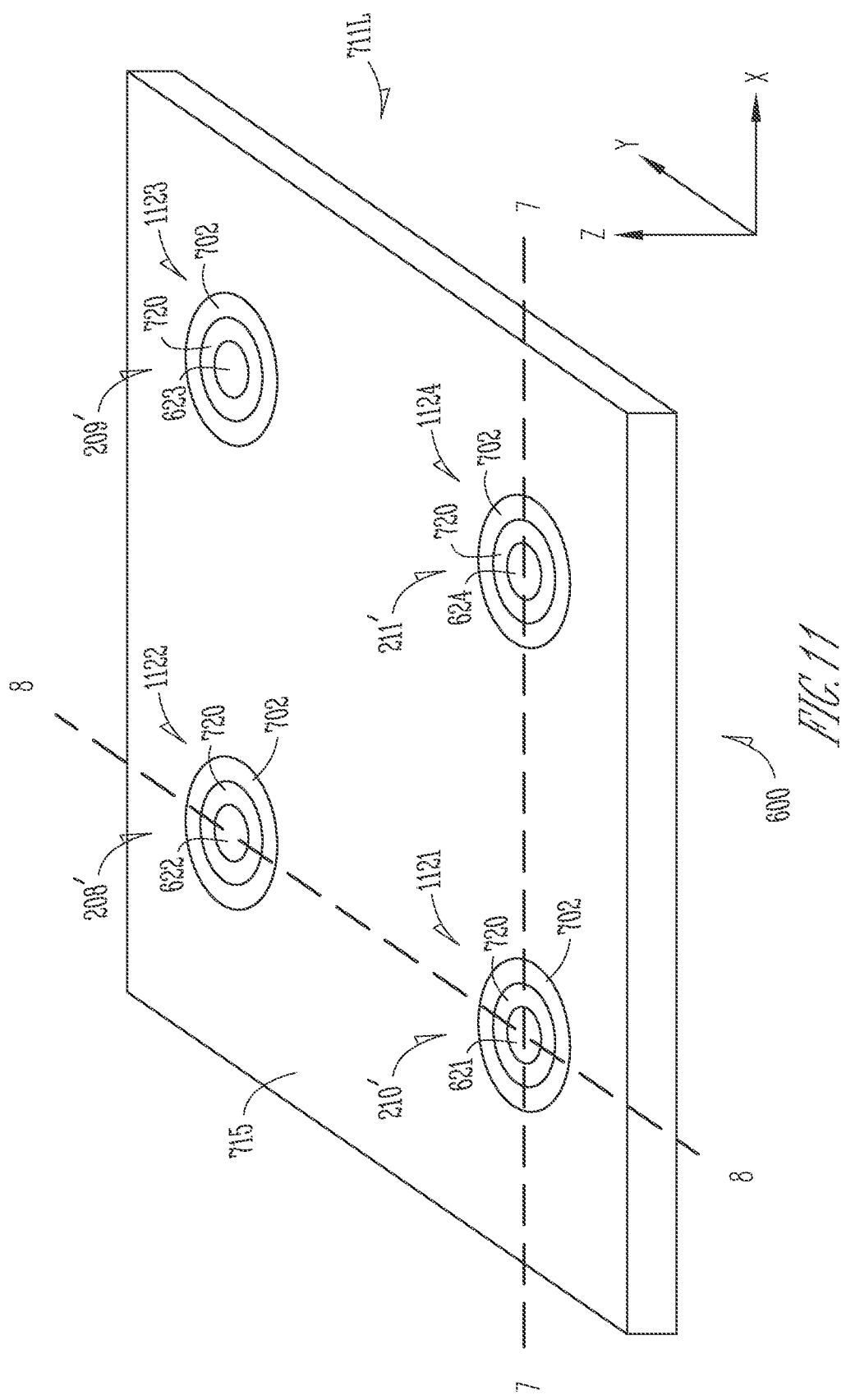

As shown in FIG. 11, dielectric 715 can have a plate structure (e.g., dielectric plate structure) with openings. Thus, dielectric 715 shown in FIG. 7 can be part of a dielectric plate shown in FIG. 11. Level 711L of memory device 600 can include openings 1121, 1122, 1123, and 1124 at dielectric 715 that are void of the material (dielectric material) that forms the structure (e.g., dielectric plate structure) of dielectric 717. Charge storage structure 702 of each of memory cells 208', 209', 210', and 211' can be located at (e.g., conforming to side wall of) a respective opening among openings 1121, 1122, 1123, and 1124. Material 720 of each of memory cells 208', 209', 210', and 211' can be located at (e.g., conforming to the side wall of) charge storage structure 702 of a respective memory cell among memory cells 208', 209', 210', and 211'.

Data lines 621, 622, 623, and 624 can pass through and contact (e.g., can be electrically coupled to) respective materials 720 (e.g., write channel regions) at the locations of openings 1121, 1122, 1123, and 1124. Thus, data lines 621, 622, 623, and 624 can be electrically coupled to channel regions of respective memory cells 208', 209', 210', and 211'.

Charge storage structure 702 (FIG. 7 and FIG. 11) can include a charge storage material (or a combination of materials), which can include a piece (e.g., a layer) of semiconductor material (e.g., polysilicon), a piece (e.g., a layer) of metal, or a piece of material (or materials) that can trap charge. The materials for charge storage structure 702 and conductive regions 741T and 741B of access line 741 can be the same or can be different.

Material 720 (FIG. 7 and FIG. 11) of a particular memory cell (e.g., memory cell 210') can form a source (e.g., source terminal), a drain (e.g., drain terminal), or a channel region (e.g., write channel region) between the source and the drain of transistor T2 of that particular memory cell (e.g., memory cell 210'). For example, as shown in FIG. 7 and FIG. 11, the source, channel region, and the drain of transistor T2 of memory cell 210' can be formed from a single piece of the same material (or alternatively, a single piece of the same combination of materials) such as material 720. Therefore, the source, the drain, and the channel region of transistor T2 of memory cell 210' can be formed from the same material (e.g., material 720) of the same conductivity type (e.g., either n-type or p-type).

Material 720 (e.g., the write channel region of transistor T2) of a particular memory cell (e.g., memory cell 210') of memory device 600 can be part of a write path of that particular memory cell. For example, material 720 of memory cell 210' can be part of a write path of memory cell 210' that can carry a current (e.g., write current) during a write operation of storing information in memory cell 210'. For example, during a write operation, to store information in memory cell 210' in FIG. 7, material 720 of memory cell 210' can conduct a current (e.g., write current) between data line 621 and charge storage structure 702 of memory cell

210'. The direction of the write current can be from data line 621 to charge storage structure 702 of memory device 210'. In the example where transistor T2 is an NFET (e.g., a NMOS), the current (e.g., write current) can include an electron conduction (e.g., electron conduction in the direction from data line 621 to charge storage structure 702 through material 720 (the channel region of transistor T2) of memory cell 210'.

Materials 720 can include a structure (e.g., a piece (e.g., a layer)) of semiconductor material. In the example where transistor T2 is an NFET (as described above), material 720 can include n-type semiconductor material (e.g., n-type silicon).

In another example, the semiconductor material that forms material 720 can include a piece of oxide material. Examples of the oxide material used for materials 720 include semiconducting oxide materials, transparent conductive oxide materials, and other oxide materials.

As an example, material 720 can include at least one of zinc tin oxide (ZTO), indium zinc oxide (IZO), zinc oxide ($ZnO_x$), indium gallium zinc oxide (IGZO), indium gallium silicon oxide (IGSO), indium oxide ($InO_x$, $In_2O_3$), tin oxide ($SnO_2$), titanium oxide (TiOx), zinc oxide nitride ($Zn_xO_yN_z$), magnesium zinc oxide ($Mg_xZn_yO_z$), indium zinc oxide ($In_xZn_yO_z$), indium gallium zinc oxide ($In_xGa_yZn_zO_a$), zirconium indium zinc oxide ($Zr_xIn_yZn_zO_a$), hafnium indium zinc oxide ($Hf_xIn_yZn_zO_a$), tin indium zinc oxide ($Sn_xIn_yZn_zO_a$), aluminum tin indium zinc oxide ($Al_xSn_yIn_zZn_aO_d$), silicon indium zinc oxide ($Si_xIn_yZn_zO_a$), zinc tin oxide ($Zn_xSn_yO_z$), aluminum zinc tin oxide ($Al_xZn_ySn_zO_a$), gallium zinc tin oxide ($Ga_xZn_ySn_zO_a$), zirconium zinc tin oxide ($Zr_xZn_ySn_zO_a$), indium gallium silicon oxide (InGaSiO), and gallium phosphide (GaP).

Using the material listed above in memory device 700 provides improvement and benefits for memory device 700. For example, during a read operation, to read information from a selected memory cell (e.g., memory cell 210'), charge from charge storage structure 702 of the selected memory cell may leak to transistor T2 of the selected memory cell. Using the material listed above for the channel region (e.g., material 720) of transistor T2 can reduce or prevent such a leakage. This improves the accuracy of information read from the selected memory cell and improves the retention of information stored in the memory cells of the memory device (e.g., memory device 700) described herein.

The materials listed above are examples of material 720. However, other materials (e.g., a relatively high band-gap material) different from the above-listed materials can be used.

As shown in FIG. 7, each of memory cells 210' and 211' can include transistor T1, which can include a portion 710 electrically coupled to a respective data line (e.g., data line 621 or 622). Portion 710 can form part of a channel region (e.g., read channel region) of transistor T1 of a respective memory cell (e.g., memory cell 210' or 211').

Memory device 600 can include a common conductive connection 797, which can be coupled to the ground connection of memory device 600 or can be part of the ground connection of memory device of memory device 600. For example, during an operation of memory device 600, common conductive connection 797 can receive a signal that can be at ground potential (e.g., 0V). Common conductive connection 797 can also be electrically coupled to portion 710 of transistor T1 of each of memory cells 210' and 211'. Common conductive connection 797 can be part of a ground connection that can correspond to ground connection 297 of memory device 200 of FIG. 2.

Figure 12:
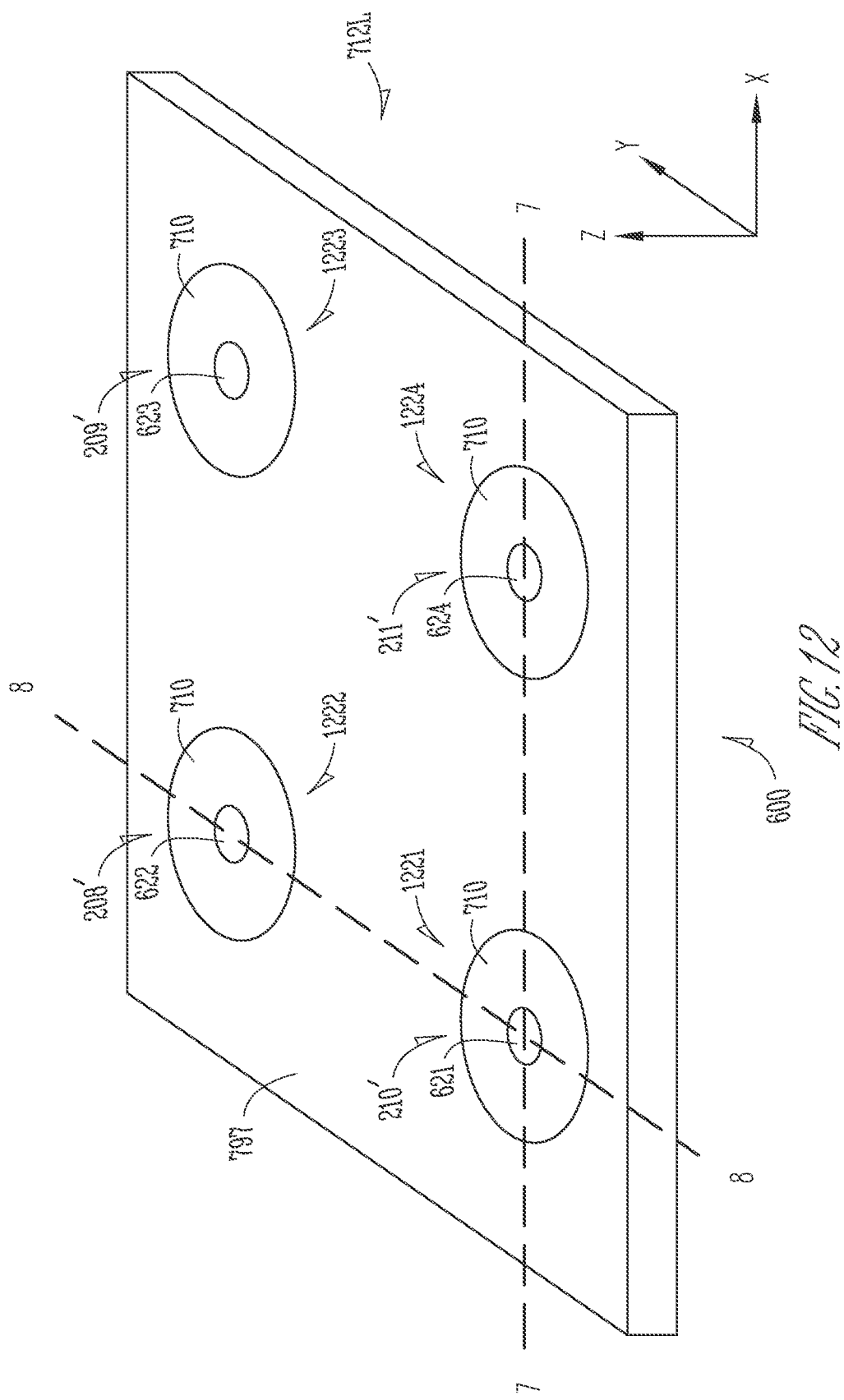

As shown in FIG. 12, common conductive connection 797 can have a plate structure (e.g., conductive plate structure) with openings. Thus, conductive connection 797 shown in FIG. 7 can be part of a conductive plate shown in FIG. 12. Level 712L of memory device 600 can include openings (e.g., spaces) 1221, 1222, 1223, and 1224 at common conductive connection 797 that are void of the material (conductive material) that forms the structure (e.g., conductive plate structure) of common conductive connection 797. Portion 710 of each of memory cells 208', 209', 210', and 211' can be located at (e.g., conforming to side wall of) a respective opening among openings 1221, 1222, 1223, and 1224.

Data lines 621, 622, 623, and 624 can pass through and contact (e.g., can be electrically coupled to) respective portions 710 (e.g., read channel regions) at the location of openings 1221, 1222, 1223, and 1224. Thus, data lines 621, 622, 623, and 624 can be electrically coupled to read channel regions of respective memory cells 208', 209', 210', and 211'.

Portion 710 (FIG. 7 and FIG. 12) can include a semiconductor material. Example materials for portion 710 include silicon, polysilicon (e.g., undoped or doped polysilicon), germanium, silicon-germanium, or other semiconductor materials, and semiconducting oxide materials (oxide semiconductors, e.g., SnO or other oxide semiconductors).

Portion 710 (e.g., the read channel region of transistor T1) of a particular memory cell (e.g., memory cell 210') of memory device 600 can be part of a read path of that particular memory cell. For example, portion 710 of memory cell 210' can be part of a read path of memory cell 210' that can carry a current (e.g., read current) during a read operation of reading information from memory cell 210'. For example, during a read operation, to read information from memory cell 210' in FIG. 7, portion 710 of memory cell 210' can conduct a current (e.g., read current) between data line 621 and common conductive connection 797 (e.g., ground connection). The direction of the read current can be from data line 221 to common conductive connection 797 through portion 710. In the example where transistor T1 is a PFET (e.g., a PMOS), the current (e.g., read current) can include a hole conduction (e.g., hole conduction in the direction from data line 621 to common conductive connection 797 through portion 720 (the channel region of transistor T1) of memory cell 210').

In the example where transistor T1 is a PFET and transistor T2 is an NFET, the material that forms portion 710 can have a different conductivity type from material 720. For example, portion 710 can include p-type semiconductor material (e.g., p-type silicon) regions, and material 720 can include n-type semiconductor material (e.g., n-type gallium phosphide (GaP)) regions.

As shown in FIG. 7 and FIG. 8, conductive region 741T of access line 741 can span across (e.g., overlap in the X-direction and the Y-direction) part of material 720 and part of portion 710 of transistor T2 and T1, respectively, of each of memory cells 208', 209', 210', and 211' of deck 605₃. As described above, material 720 can form part of write channel region of transistor T2 and portion 710 can form part of read channel region of transistor T1. Thus, conductive region 741T can span across (e.g., overlap) part of both the read and write channel regions of transistors T1 and T2, respectively, of each of memory cells 208', 209', 210', and 211' of deck 605₃. Similarly, conductive region 742T of access line 742 can span across (e.g., overlap) part of both read and write channel regions of transistors T1 and T2, respectively, of each of the memory cells of deck 605₃.

The spanning (e.g., overlapping) of conductive region 741T of access line 741 across read and write channel regions of transistors T1 and T2 allows access line 741 (a single access line) to control (e.g., to turn on or turn off) both transistors T1 and T2 of the memory cells of deck $605_3$. Similarly, the spanning (e.g., overlapping) of conductive region 742T of access line 742 across read and write channel regions of transistors T1 and T2 allows access line 742 (a single access line) to control (e.g., turn on or turn off) both transistors T1 and T2 of the memory cells of deck $605_2$.

As mentioned above, the description with respect to FIG. 7 through FIG. 12 concentrates on details of the elements of deck $605_3$. Deck $605_2$ (and other decks) of memory device 600 can have similar elements. For example, although not shown in FIG. 7, deck $605_2$ can have different levels between the levels where conductive regions 742T and 742B (e.g., which are parts of respective conductive plates) are located. For example, deck $605_2$ can include a level (similar to level 711L) that can include dielectrics 715 (e.g., a dielectric plate structure), charge storage structure 702, and material 720 (e.g., write channel region contacting data line 621 or 622) for each of memory cells 212' and 213'. In another example, deck $605_2$ can include a level (similar to level 712L) that can include common conductive connection 797 (e.g., common conductive plate) and portion 710 (e.g., read channel region contacting data line 621 or 622) for each of memory cells 212' and 213'.

The description above with reference to FIG. 6 through FIG. 12 show that the elements (e.g., the memory cells the access lines (conductive plates)) can be arranged (e.g., formed) in different levels (e.g., layers) one level over another memory device 600. This can allow multiple decks of memory device 600 to be formed together. Thus, the cost (e.g., cost per bit) of forming memory device 600 can be reduced.

Figure 13:
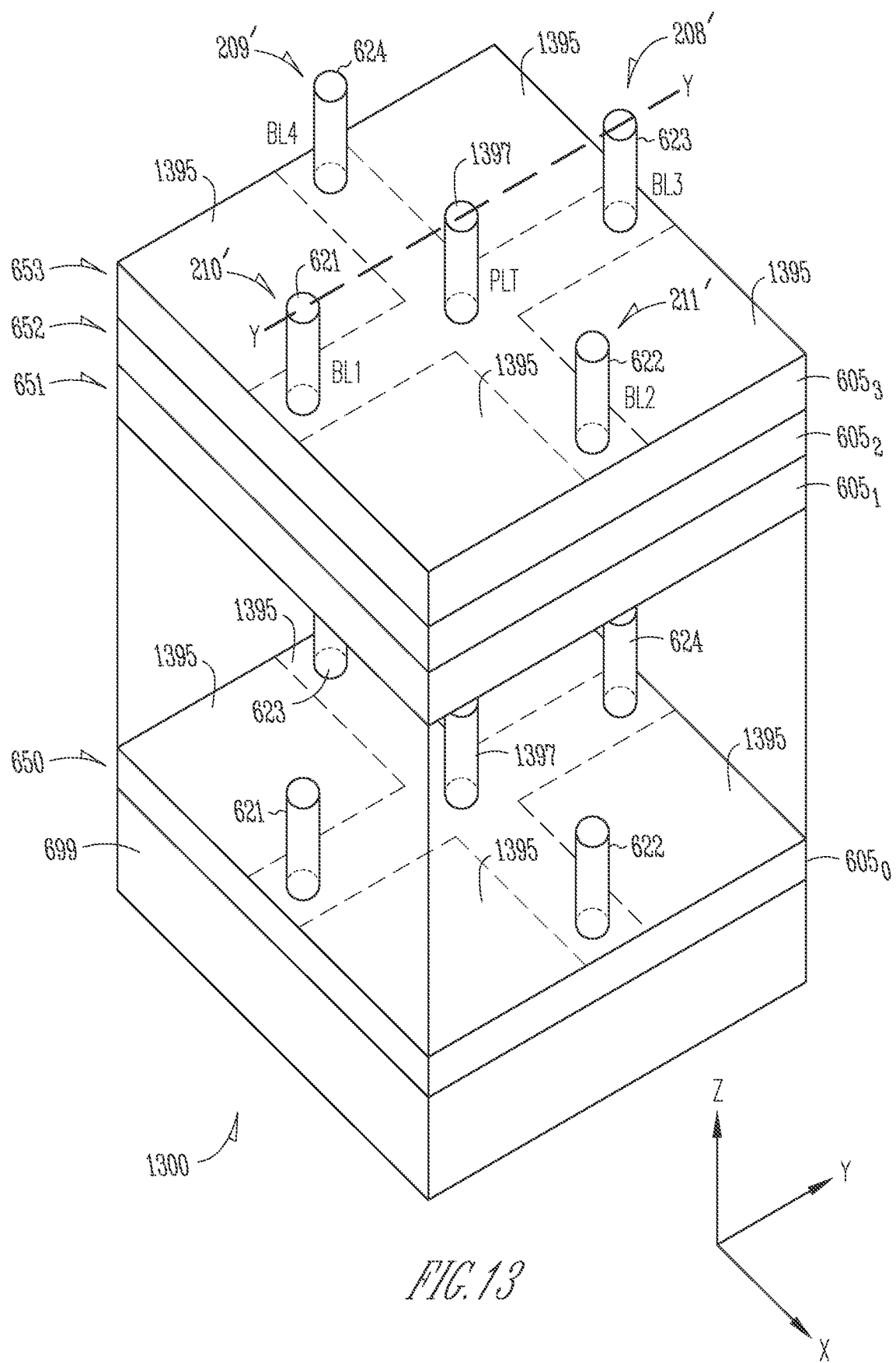
FIG. 13 through FIG. 18 show different views of a structure of a memory device including multiple decks of memory cells and a vertical common conductive connection, according to some embodiments described herein.

FIG. 13 shows a structure of a memory device 1300 including multiple decks $605_0$, $605_1$, $605_2$, and $605_3$ and a vertical common conductive connection 1397, according to some embodiments described herein. Memory device 1300 can include elements that are similar or identical to some of the elements of memory device 600 (FIG. 6 through FIG. 12). Thus, similar or identical elements between memory device 600 and memory device 1300 (FIG. 13 through FIG. 18) are given the same labels and detailed description of such elements are not repeated in the description of memory device 1300.

Differences between memory devices 600 and 1300 include the structure and location of common conductive connection 1397. Similar to common conductive connection 797 of memory device 600 (FIG. 7 and FIG. 8), common conductive connection 1397 can be electrically coupled to the read channel regions of transistors T1 and to the ground connection of memory device 1300. However, unlike the horizontal plate structure (e.g., a layer of conductive material in the X-Y plane) of common conductive connection 797, common conductive connection 1397 of memory device 1300 can have a pillar structure (e.g., a vertical column of conductive material) that extends in the Z-direction (e.g., extends vertically) perpendicular to substrate 699. Another difference between memory devices 600 and 1300 includes the relatively smaller size of each of the memory cells (e.g., memory cells 208', 209', 210', and 211') as described in more detail below.

As shown in FIG. 13, common conductive connection 1397 can be located at a middle (e.g., center) location relative to the locations that are bounded (e.g., surrounded) by data lines 621, 622, 623, and 624. Common conductive connection 1300 can be coupled to the ground connection or can be part of a ground connection that can correspond to ground connection 297 of memory device 200 of FIG. 2. In FIG. 13, common conductive connection 1300 can receive a signal PLT, which can be at ground potential (e.g., PLT=0V). The pillar structure of common conductive connection 1397 can extend from one deck to another deck (e.g., extend through decks $605_0$, $605_1$, $605_2$, and $605_3$). Common conductive connection 1397 can be formed from a conductive material (e.g., conductively doped polysilicon, metal, or other conductive materials). The material of common conductive connection 1397 can be the same as the material of each of data lines 621, 622, 623, and 624. Common conductive connection 1397 can be formed at the same time (e.g., in the same process step) when data lines 621, 622, 623, and 624 are formed.

As shown in FIG. 13, memory device 1300 can include dielectrics 1395 that can extend (e.g., vertically) in the Z-direction and occupy (e.g., filled) portions (e.g., four corners) of each of decks $605_0$, $605_1$, $605_2$, and $605_3$. Dielectrics 1395 can include various oxides (e.g., low-K materials, or other oxides), porous oxide and air gaps, or other dielectric materials.

As described in more details below (e.g., with reference to FIG. 17), dielectrics 1395 can be isolation structures that electrically separate (isolate) some elements (e.g., the write channel regions of transistors T2) of the memory cells in the same deck from each other. This electrical separation also electrically separates data lines 621, 622, 623, and 624 from each other.

Figure 14:
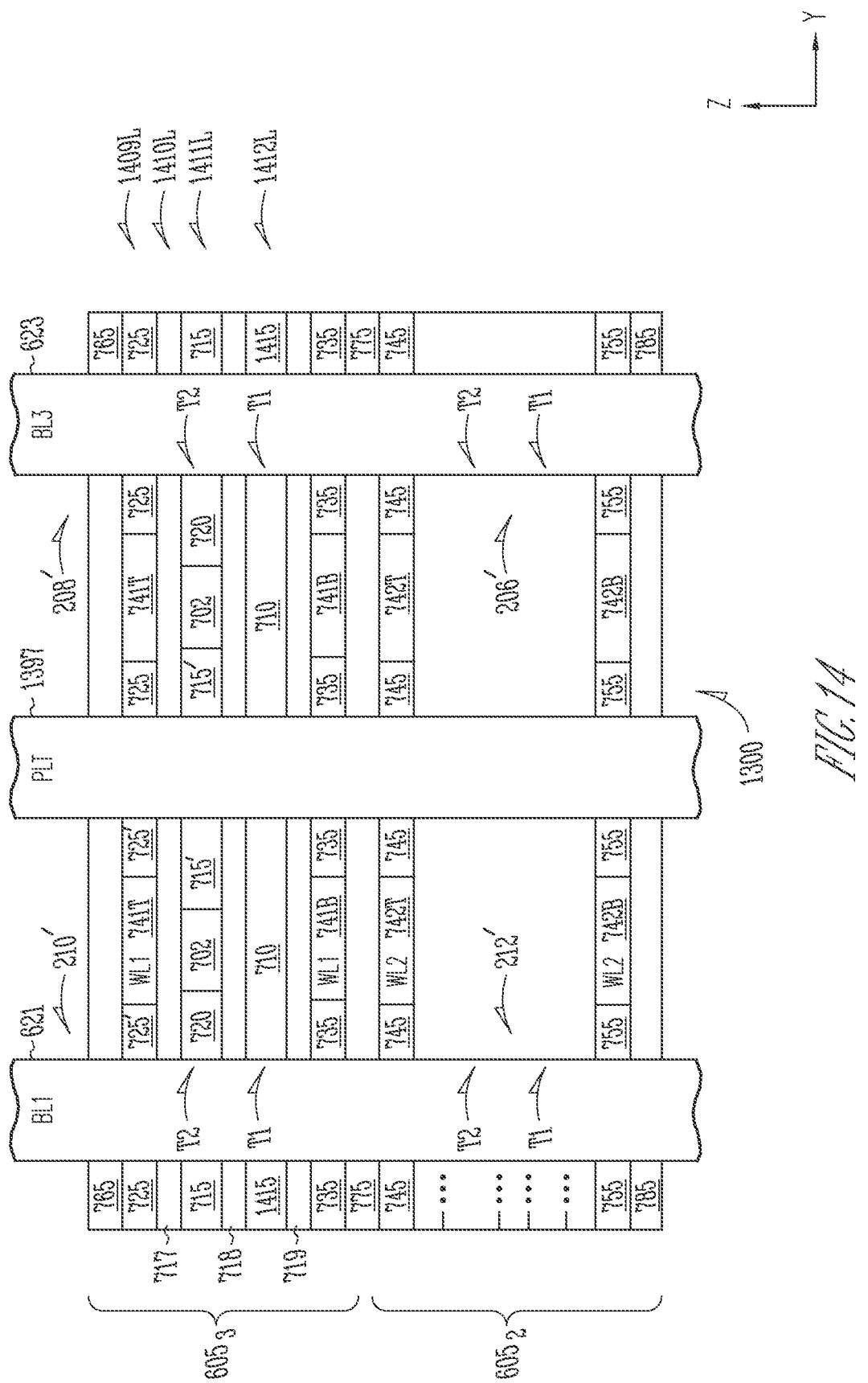

In FIG. 14, line Y-Y indicates a location of a section (e.g., a cross-sectional view) of a portion of memory device 1300 shown in FIG. 14. For simplicity, the description of FIG. 14 concentrates on details of the elements of deck $605_3$. Deck $605_2$ (and other decks) of memory device 1300 can have similar elements.

FIG. 14 shows a view (e.g., cross-sectional view) of a portion of memory device 600 taken along line Y-Y of FIG. 13. As shown in FIG. 14, deck $605_3$ can include levels (e.g., different layers of materials) 1409L, 1410L, 1411L, and 1412L. FIG. 15, FIG. 16, FIG. 17, and FIG. 18 show perspective views (e.g., 3-D views) of levels 1409L, 1410L, 1411L, and 1412L, respectively.

As shown in FIG. 14, common conductive connection 1397 can be located between data lines 621 and 622. Common conductive connection 1397 can be electrically coupled to (e.g., can contact) portions of memory cells 210', 211', 212', and 213'. For example, common conductive connection 1397 can be electrically coupled to the read channel regions (e.g., portions 710) of memory cells 208' and of deck $605_3$ and the read channel regions (e.g., not shown) of memory cells 206 and 212' of deck $605_2$.

Common conductive connection 1397 can be electrically separated from conductive regions 741T and 741B (of access line 741, not labeled) by dielectrics 725 and 735, respectively. Common conductive connection 1397 can be electrically separated from conductive regions 742T and 742B (of access line 742, not labeled) by dielectrics 745 and 755, respectively.

Other elements of memory device 1300 shown in FIG. 14 can be similar to or identical to those of memory device 600 shown in FIG. 7 and FIG. 8. For example, as shown in FIG. 14, level 1409L can include conductive region 741T, dielectrics 725, and dielectric 725'. Level 1410L can include charge storage structure 702 of a respective memory cell (e.g., memory cell 208' or 210'), material 720 (e.g., write channel region of a respective memory cell (e.g., memory cell 208' or 210')), and dielectrics 715 and 715'. Level 1412L can include portion 710 (e.g., read channel region of a respective memory cell), and dielectrics 1415.

The following description with reference to FIG. 15, FIG. 16, FIG. 17, and FIG. 18 describes some details (in 3-D views) of levels 1409L, 1410L, 1411L, and 1412L, respectively, of memory device 1300 shown in FIG. 14. In each of FIG. 15, FIG. 16, FIG. 17, and FIG. 18, line Y-Y indicates corresponding locations of cross-sectional views of levels 1409L, 1410L, 1411L, and 1412L of memory device 1300 shown in FIG. 14. Each of FIG. 15 through FIG. 18 also shows relative locations of memory cells 208', 209', 210', and 211' of deck of $605_3$ memory device 1300 of FIG. 13. Each of FIG. 15 through FIG. 18 also shows locations of dielectrics 1395 of memory device 1300 of FIG. 13.

Figure 15:
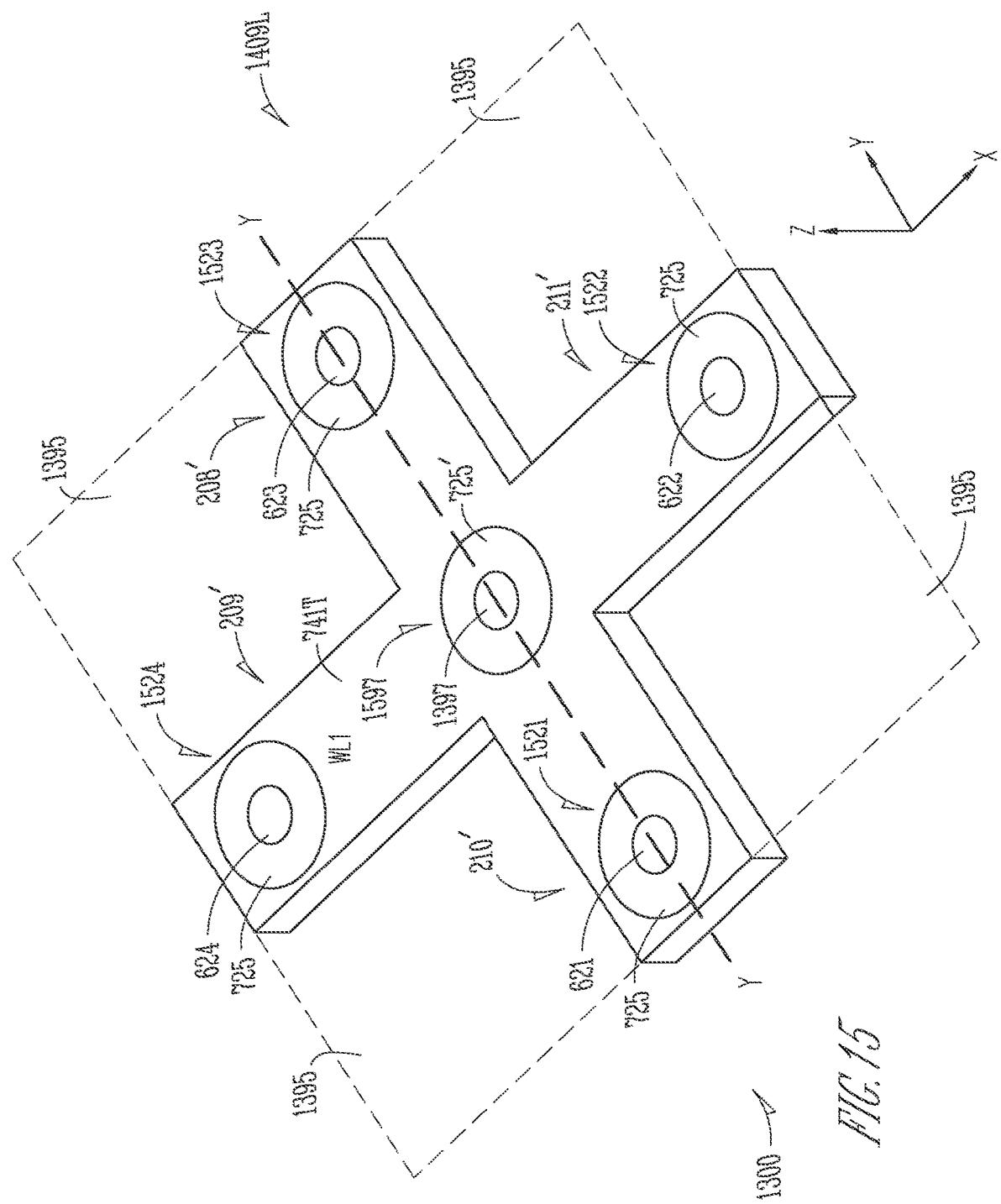

As shown in FIG. 15, level 1409L of memory device 1300 can include openings (e.g., spaces) 1521, 1522, 1523, 1524, and 1597 at conductive region 741T (e.g., top conductive region of the access line of deck $605_3$). Dielectrics 725 and 725' can be located at (e.g., conforming to side walls of) respective openings 1521, 1522, 1523, and 1524. Data lines 621, 622, 623, 624, and common conductive connection 1397 can pass through respective dielectrics 725 and 725' at the locations of respective openings 1521, 1522, 1523, 1524, and 1597. Thus, each of data lines 621, 622, 623, 624, and common conductive connection 1397 can be surrounded (and contacted) by a dielectric (e.g., dielectric 725 or 725') at a respective opening among openings 1521, 1522, 1523, 1524, and 1597. Therefore, data lines 621, 622, 623, 624, and common conductive connection 1397 are electrically separated from conductive region 741T (by respective dielectrics 725 and 725'). Conductive region 741B (e.g., bottom conductive region of the access line of deck $605_3$) and dielectrics 735 (FIG. 7) can have a structure similar to that of conductive region 741T and dielectric 725 of FIG. 15.

Figure 16:
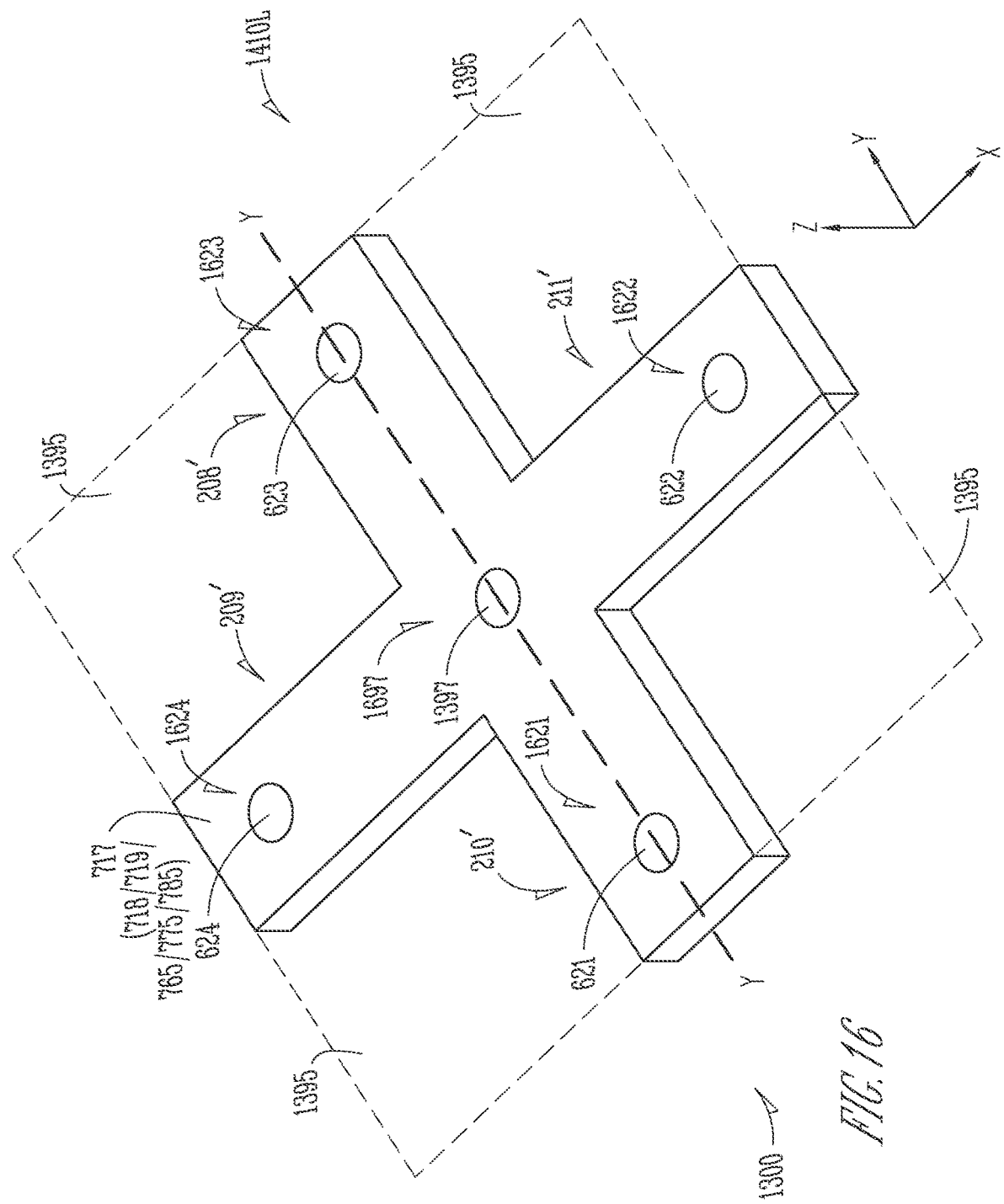

As shown in FIG. 16, level 1410L of memory device 1300 can include openings (e.g., spaces) 1621, 1622, 1623, 1624, and 1697 at dielectric 717 that are void of the material (dielectric material) that forms the structure (e.g., plate structure) of dielectric 717. Data lines 621, 622, 623, and 624, and common conductive connection 1397 can pass through (and contact dielectric 717) at respective openings 1621, 1622, 1623, 1624, and 1697 of FIG. 16. Other dielectrics 717, 718, 719, 765, 775, and 785 (FIG. 14) can have a structure similar to that of dielectric 717 of FIG. 16.

Figure 17:
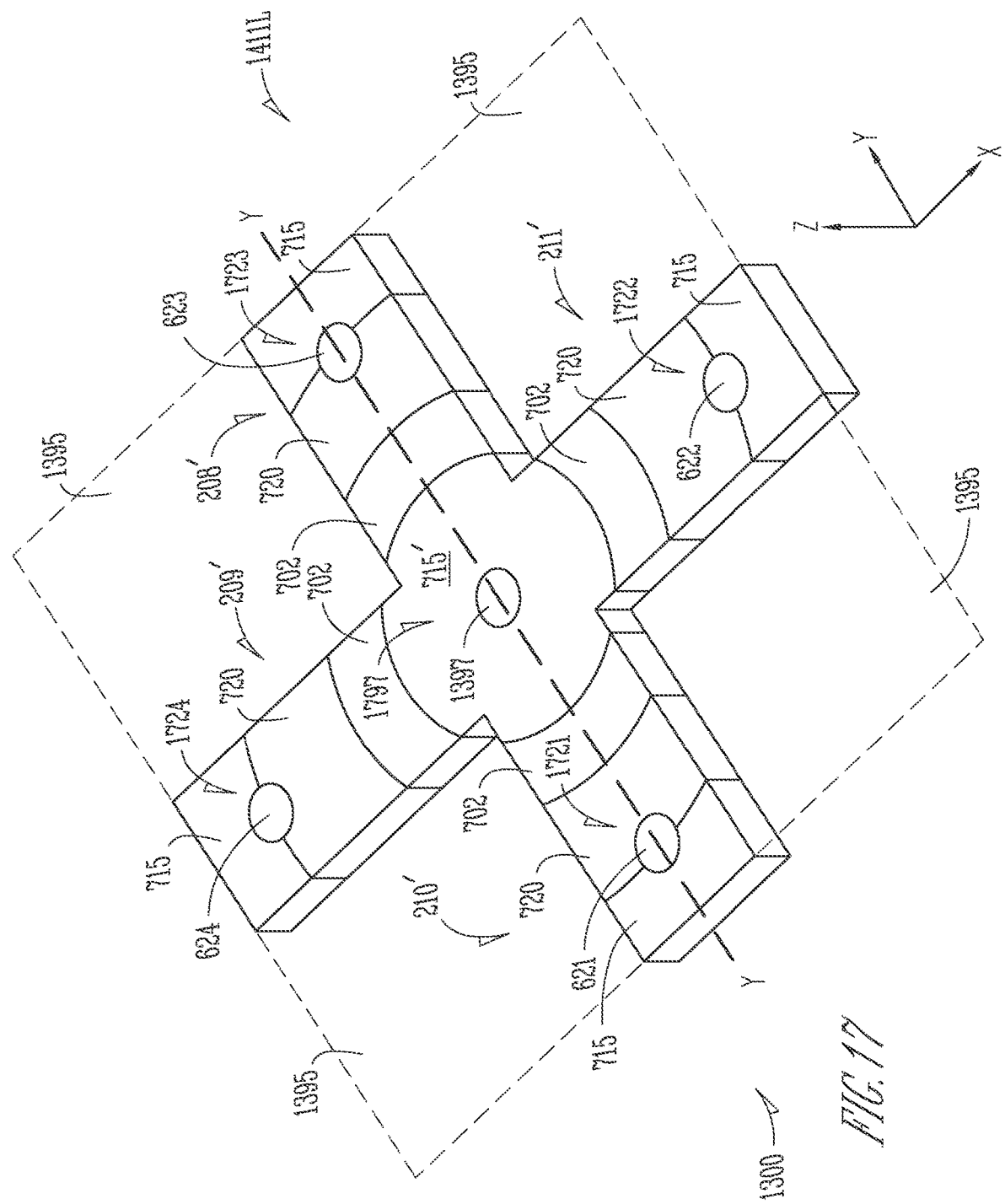

As shown in FIG. 17, each of memory cells 208', 209', 210', and 211' can includes dielectric 715, material 720 (e.g., write channel region), and charge storage structure 702. Materials 720 and charge storage structures 702 of memory cells 208', 209', 210', and 211' can be electrically separated from each other by dielectrics 1395.

As shown in FIG. 17, level 1411L of memory device 1300 can include openings (e.g., spaces) 1721, 1722, 1723, and 1724. Each of openings 1721, 1722, 1723, and 1724 can have a side wall (not labeled) formed by a portion of material 720 (e.g., write channel region) of a respective memory cell (one of memory cells 208', 209', 210', and 211') and by a portion of one of dielectrics 715. Data lines 621, 622, 623, and 624 can pass through and contact (e.g., can be electrically coupled to) respective materials 720 (e.g., write channel regions) at the locations of openings 1721, 1722, 1723, and 1724. Thus, data lines 621, 622, 623, and 624 can be electrically coupled to channel regions of respective memory cells 208', 209', 210', and 211'.

Level 1411L of memory device 1300 can also include an opening (e.g., a space) 1797. Opening 1797 can have a side wall (not labeled) formed by a portion of charge storage structure 702 of each of memory cells 208', 209', 210', and 211'. Dielectric 715' can be located at (e.g., conforming to side walls of) opening 1797. Common conductive connection 1397 can pass through dielectric 715' at the location of opening 1797 and can be surrounded (and contacted) by dielectric 715'. Thus, common conductive connection 1397 is electrically separated from charge storage structure 702 of each of memory cells 208', 209', 210', and 211'.

The process of forming level 1411L (FIG. 17) of memory device 1300 can include forming a semiconductor material (that subsequently becomes write channel regions), forming a charge storage material (surrounded by the semiconductor material), and forming dielectric 715' (surrounded by the charge storage material). Then, part of each of the semiconductor material, the charge storage material, and dielectric 715' (at locations where dielectrics 1395 will be subsequently formed) can be removed (e.g., by etching). Then, the locations (e.g., empty space) where part of each of the semiconductor material, the charge storage material, and dielectric 715' were removed can be filled with a dielectric material. Dielectrics 1395 can be part of the dielectric material.

FIG. 17 shows how charge storage structure 702 of one memory cell can be electrically separated from charge storage structure 702 of another memory cell by a respective dielectric 1395. However, in an alternative structure of memory device 1300, charge storage structures 702 of two adjacent memory cells or all four memory cells among memory cells 208', 209', 210', and 211' can be electrically coupled to each other. For example, FIG. 17 shows the corners (four corners) of dielectrics 1395 adjacent opening 1797 extending into dielectric 715', thereby electrically separating charge storage structures 702. However, in an alternative structure, the corners (four corners) of dielectrics 1395 adjacent opening 1797 may not extend into dielectric 715' and may extend partially into charge storage structures 702. Thus, in such an alternative structure, dielectrics 1395 do not completely separate charge storage structures 702 from each other. Therefore, charge storage structures 702 can be electrically coupled to each other in such an alternative structure of memory device 1300.

Figure 18:
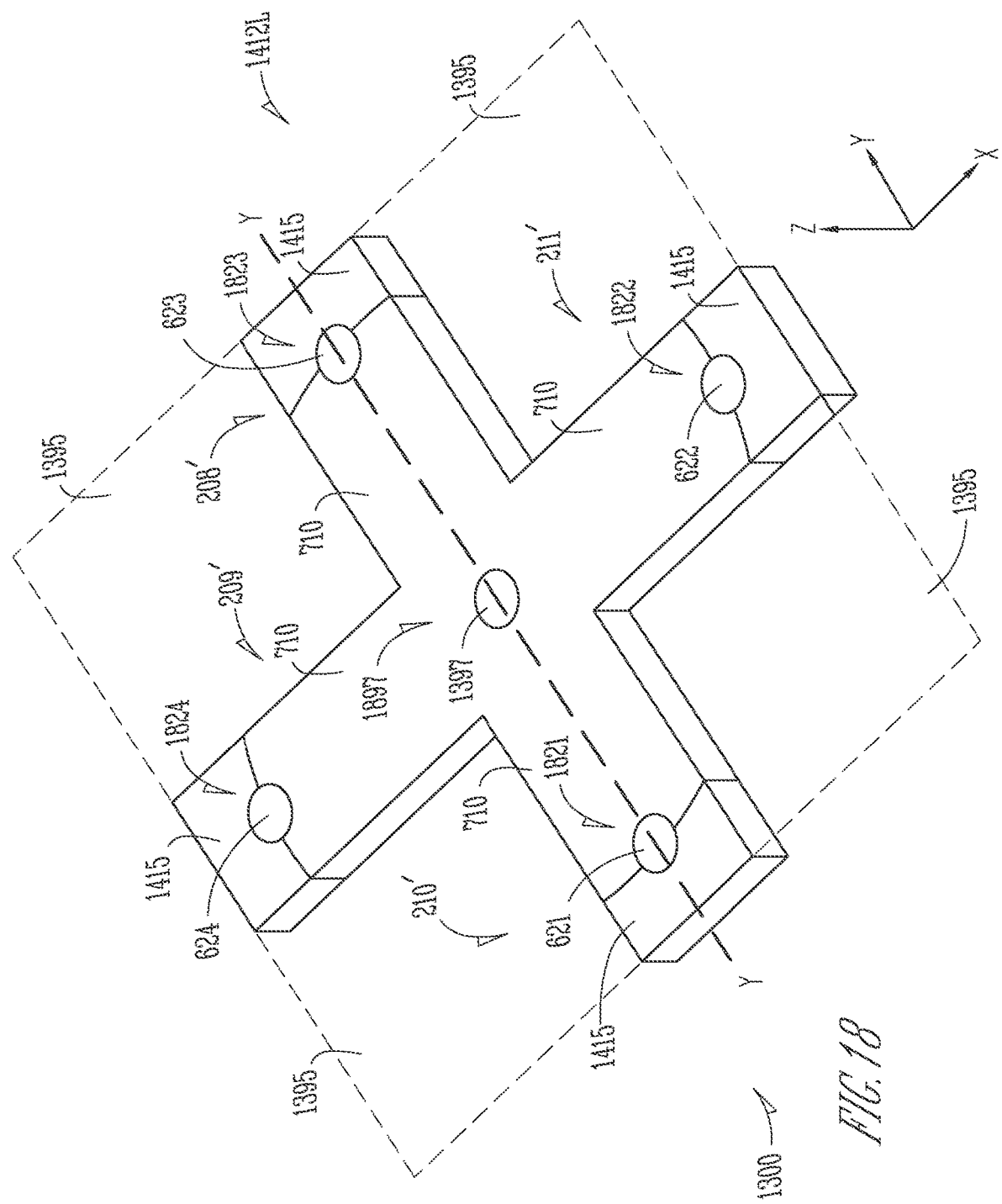

As shown in FIG. 18, level 1412L of memory device 1300 can include openings (e.g., spaces) 1821, 1822, 1823, and 1824. Each of openings 1821, 1822, 1823, and 1824 can have a side wall (not labeled) formed by part of portion 710 (e.g., read channel region) of a respective memory cell (one of memory cells 208', 209', 210', and 211') and part of one of dielectrics 1415. Data lines 621, 622, 623, and 624 can pass through and contact (e.g., can be electrically coupled to) respective portions 710 (e.g., read channel regions) at the locations of openings 1821, 1822, 1823, and 1824. Thus, data lines 621, 622, 623, and 624 can be electrically coupled to read channel regions respective of memory cells 208', 209', 210', and 211'.

Level 1411L of memory device 1300 can also include an opening (e.g., a space) 1897. Opening 1897 can have a side wall (not labeled) formed by part of portion 710 of each of memory cells 208', 209', 210', and 211'. Common conductive connection 1397 can pass through and contact (e.g., can be electrically coupled to) portion 710 at the location of opening 1897. Thus, common conductive connection 1397 can be electrically coupled to read channel regions of respective memory cells 208', 209', 210', and 211'.

In comparison with memory device 600 (FIG. 6 through FIG. 12), memory device 1300 (FIG. 13 through FIG. 18) can have a relatively higher number of memory cell density for a given area. This can be attributed to the relative locations of the memory cells (e.g., memory cells 208', 209', 210', and 211') and common conductive connection 1397 of memory device 1300.

As mentioned above, the dimensions (e.g., physical structures) of the elements shown in the drawings described herein are not scaled. Thus, although some of the elements shown in the drawings are shown as different sizes (e.g., different thicknesses in the Z-direction and/or different diameters), such elements can have the same (e.g., substantially the same size) size (e.g., same thickness and/or same diameter). For example, as shown in FIG. 14, FIG. 15, and FIG. 17, dielectric 725' (FIG. 14 and FIG. 15) and dielectric 715' (FIG. 14 and FIG. 17) can have different diameters where dielectric 715' has a greater diameter than dielectric 725'. However, dielectrics 715' and 725' can have the same diameter. As an example, the diameter of dielectric 725' can be formed to be relatively greater (greater than its diameter shown in FIG. 14), so that the diameter of dielectric 725' can be the same as the diameter of dielectric 715'. Similarly, the diameters of dielectrics 735, 745, and 755 (FIG. 14) adjacent common conductive connection 1395 can be formed to be the same as the diameter of dielectric 715'.

The illustrations of apparatuses (e.g., memory devices 100, 200, 600, and 1300) and methods (e.g., operations of memory devices 100 and 200) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, 600, and 1300) or a system (e.g., an electronic item that can include any of memory devices 100, 200, 600, and 1300).

Any of the components described above with reference to FIG. 1 through FIG. 18 can be implemented in a number of ways, including simulation via software. Thus, apparatuses (e.g., memory devices 100, 200, 600, and 1300) or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

The memory devices (e.g., memory devices 100, 200, 600, and 1300) described herein may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 18 include apparatuses and methods using a substrate, a pillar having a length perpendicular to the substrate, a first conductive plate, a second conductive plate, a memory cell located between the first and second conductive plates and electrically separated from the first and second conductive plates, and a conductive connection. The first conductive plate is located in a first level of the apparatus and being separated from the pillar by a first dielectric located in the first level. The second conductive plate is located in a second level of the apparatus and being separated from the pillar by a second dielectric located in the second level. The memory cell includes a first semiconductor material located in a third level of the apparatus between the first and second levels and contacting the pillar and the conductive connection, and a second semiconductor material located in a fourth level of the apparatus between the first and second levels and contacting the pillar. Other embodiments, including additional apparatuses and methods, are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
   a substrate;
   a pillar extending in a direction perpendicular to the substrate;

a first conductive region located in a first level of the apparatus, the first conductive region being separated from the pillar by a first dielectric located in the first level;

a second conductive region located in a second level of the apparatus, the second conductive region being separated from the pillar by a second dielectric located in the second level;

a memory cell located between the first and second conductive regions and electrically separated from the first and second conductive regions, the memory cell including a first material located in a third level of the apparatus between the first and second levels and coupled to the pillar, and a second material located in a fourth level of the apparatus between the first and second levels and coupled to the pillar, the first and second materials having different conductivity types; and a conductive connection coupled to the first material.

2. The apparatus of claim 1, wherein the at least one of first and second materials includes polysilicon.

3. The apparatus of claim 1, wherein the first material includes polysilicon and the second material comprises semiconducting oxide material.

4. The apparatus of claim 1, wherein the conductive connection is to couple to ground connection of the apparatus.

5. The apparatus of claim 1, wherein the conductive connection includes an additional pillar extending in the direction perpendicular to the substrate, and the additional pillar includes a portion located in the first level and coupled to the first material.

6. The apparatus of claim 1, wherein the memory cell further includes a charge storage structure located in the second level and coupled to the second material, the second material is between the pillar and the charge storage structure.

7. The apparatus of claim 1, wherein the conductive connection includes a conductive region located in the third level.

8. The apparatus of claim 7, wherein the conductive region includes a portion surrounding and coupled to the first material.

9. An apparatus comprising:
a first pillar extending in a direction perpendicular to a substrate;
a second pillar extending in the direction perpendicular to the substrate;
a first memory cell including a first material located in a first level of the apparatus, the first material coupled to the first pillar;
a second memory cell including a first additional material located in the first level, the first additional material coupled to the second pillar;
a first conductive region located in the first level of the apparatus, the conductive region coupled to the first material and the first additional material; and
a second conductive region located in a second level of the apparatus, the second conductive region being separated from the first pillar by a first dielectric located in the second level and separated from the second pillar by a second dielectric located in the second level.

10. The apparatus of claim 9, further comprising a third conductive region located in a third level of the apparatus, the third conductive region being separated from the first pillar by a first additional dielectric located in the third level and separated from the second pillar by a second additional dielectric located in the third level, wherein the first and second memory cell are between the second and third conductive regions.

11. The apparatus of claim 9, wherein the first conductive region is to couple to a ground connection, and the second conductive region is part of an access line of the apparatus.

12. The apparatus of claim 9, wherein:
the first memory cell includes a first charge storage structure and a first additional material located in a third level of the apparatus, and the first additional material couples to the first pillar and the first charge storage structure;
the second memory cell includes a second charge storage structure and a second additional material located in the third level of the apparatus, and the second additional material couples to the second pillar and the second charge storage structure.

13. The apparatus of claim 12, wherein each of the first and second additional materials comprises a semiconducting oxide material.

14. An apparatus comprising:
a first pillar extending in a direction perpendicular to a substrate;
a second pillar extending in the direction perpendicular to the substrate;
a third pillar extending in the direction perpendicular to the substrate;
a first memory cell including a first material located in a first level of the apparatus, the first material coupled to the first and third pillars;
a second memory cell including a first additional material located in the first level, the first additional material coupled to the second and third pillars; and
a conductive region located in a level of the apparatus, the conductive region being separated from the first pillar by a first dielectric, separated from the second pillar by a second dielectric, and separated from the third pillar by a third dielectric, the first, second, and third dielectrics being located in the second level.

15. The apparatus of claim 14, wherein:
the first memory cell includes a first charge storage structure and a first additional material located in an additional level of the apparatus, and the first additional material contacts the first pillar and the first charge storage structure;
the second memory cell includes a second charge storage structure and a second additional material located in the additional level, and the second additional material contacts second pillar and the second charge storage structure; and
each of the first and second charge storage structures is separated from the third pillar by an additional dielectric located in the additional level.

16. The apparatus of claim 14, further comprising an additional conductive region located in a third level of the apparatus, the additional conductive region being separated from the first pillar by a first additional dielectric, separated from the second pillar by a second additional dielectric, and separated from the third pillar by a third additional dielectric, wherein the first, second, and third additional dielectrics are located in the third level.

17. The apparatus of claim 14, wherein the first and materials are electrically coupled to each other.

18. The apparatus of claim 14, wherein the conductive region includes a portion surrounding and coupled to the third dielectric.

19. The apparatus of claim 14, wherein the third pillar is between the first and second pillar.

20. The apparatus of claim 14, wherein each of the first and second pillars is part of a data line of the apparatus, the third pillar is to couple to a ground connection, and the conductive region is part of a word line of the apparatus.

\* \* \* \* \*